(12) United States Patent
Kuwano et al.

(10) Patent No.: US 6,683,959 B1
(45) Date of Patent: Jan. 27, 2004

(54) STEREOPHONIC DEVICE AND STEREOPHONIC METHOD

(75) Inventors: Koji Kuwano, Hamamatsu (JP);
Akihiro Hujita, Hamamatsu (JP);
Kenji Kamata, Hamamatsu (JP)

(73) Assignee: Kawai Musical Instruments Mfg. Co., Ltd., Shizuoka-ken (JP)

(*) Notice: Subject to any disclaimer, the term of this patent is extended or adjusted under 35 U.S.C. 154(b) by 666 days.

(21) Appl. No.: 09/664,558

(22) Filed: Sep. 18, 2000

(30) Foreign Application Priority Data

Sep. 16, 1999 (JP) .......................... 11-261297
Sep. 16, 1999 (JP) .......................... 11-261304
Sep. 16, 1999 (JP) .......................... 11-261311

(51) Int. Cl.[7] ............................................. H04R 5/00
(52) U.S. Cl. ................................ 381/17; 381/1; 381/18
(58) Field of Search .............................. 371/17, 1, 18, 371/98, 101

(56) References Cited

U.S. PATENT DOCUMENTS 5,923,576 A * 7/1999 Hajdu et al. ............... 708/313

6,563,869 B1 * 5/2003 Yamada ..................... 381/63

* cited by examiner

Primary Examiner—Melur Ramakrishnaiah
(74) Attorney, Agent, or Firm—Birch, Stewart, Kolasch & Birch, LLP

(57) ABSTRACT

The data put to the digital filter operation and the data not put to the digital filter operation are synthesized together at a predetermined distribution ratio to form a stereophonic sound image. A digital filter operation is executed for forming a sound image in the vertical direction that reaches one ear being diffracted by the head, and a digital filter operation is executed for forming a sound image in the vertical direction in the other ear, thereby to form a stereophonic sound image in the vertical direction. Of the sound generated from one of the different sound systems, the sound reaching one ear is canceled and the only sound reaching the other ear is validated by generating a counterbalance sound component. Excess sound component is erased, the excess sound component being generated from the other sound system and being not desired for forming the stereophonic sound image.

23 Claims, 19 Drawing Sheets

| | FILTER COEFFICIENTS |
|---|---|
| −90° | a,b,c,d,e,A,B,C,D,E,F,G,H ······ |
| −80° | a,b,c,d,e,A,B,C,D,E,F,G,H ······ |
| −70° | a,b,c,d,e,A,B,C,D,E,F,G,H ······ |
| | a,b,c,d,e,A,B,C,D,E,F,G,H ······ |
| ⋮ | |
| ±0° | a,b,c,d,e,A,B,C,D,E,F,G,H ······ |
| ⋮ | |
| +90° | a,b,c,d,e,A,B,C,D,E,F,G,H ······ |

⋮

(A) CHARACTERISTICS OF DIGITAL FILTER 41

(B) CHARACTERISTICS OF DIGITAL FILTER 46

(C) CHARACTERISTICS OF DIGITAL FILTER 51

(D) CHARACTERISTICS OF DIGITAL FILTER 56

(E) CHARACTERISTICS OF DIGITAL FILTER 61

(F) CHARACTERISTICS OF DIGITAL FILTER 66

| | FILTER COEFFICIENTS, LEVEL COEFFICIENTS, DELAY COEFFICIENTS |
|---|---|
| 0° | f,g,h,i,j,k,l,m,K,L,M,N,O,P,Q,R,S,T,IR,IL,JR,JL,DL |
| 10° | f,g,h,i,j,k,l,m,K,L,M,N,O,P,Q,R,S,T,IR,IL,JR,JL,DL |
| 20° | f,g,h,i,j,k,l,m,K,L,M,N,O,P,Q,R,S,T,IR,IL,JR,JL,DL |
| ⋮ | ⋮ |
| 350° | f,g,h,i,j,k,l,m,K,L,M,N,O,P,Q,R,S,T,IR,IL,JR,JL,DL |

⋮

(A)

CHARACTERISTICS OF
DIGITAL FILTERS 121, 141

(B)

CHARACTERISTICS OF
DIGITAL FILTERS 126, 146

(C)

CHARACTERISTICS OF
DIGITAL FILTERS 131, 151

(D)

CHARACTERISTICS OF
DIGITAL FILTERS 136, 156

| | FILTER COEFFICIENTS |
|---|---|
| 1 | p,q,r,s,t,u,v,w,x,y,z |
| 2 | p,q,r,s,t,u,v,w,x,y,z |
| ⋮ | ⋮ |
| n | p,q,r,s,t,u,v,w,x,y,z |

(A)

(B)

STEREOPHONIC DEVICE AND STEREOPHONIC METHOD

BACKGROUND OF THE INVENTION

1. Field of the Invention

The present invention relates to a stereophonic device and a stereophonic method and, particularly, to a device and a method of forming stereophonic sound image using sound data that are generated.

2. Prior Art

So far, the same sound data have been fed to a right speaker and to a left speaker to form a stereophonic sound image. The magnitude of the sound level fed to the two speakers is relatively changed over, so that the stereophonic sound image moves.

For example, when the volume of sound of the right speaker becomes smaller than the volume of sound of the left speaker, the stereophonic sound image moves toward the left speaker. Further, when the volume of sound of the left speaker becomes smaller than the volume of sound of the right speaker, the stereophonic sound image moves toward the right speaker.

SUMMARY OF THE INVENTION

However, the above stereophonic sound image is simply created by changing the volume of sound, and is not a true stereophonic sound image.

According to the present invention, the generated sound data are subjected to the digital filter operation by a first digital filter means and by a second digital filter means. The first digital filter means and the second digital filter means execute the same operation, the difference being the filter coefficient only that is supplied and, at the same time, the digital filter operation is executed in parallel therewith. The sound data from the first digital filter means and the sound data from the second digital filter means are simultaneously supplied to different sound systems. Therefore, even though the sound data may be the same, the sound systems generate sounds of different quality of tone, and a delicate stereophonic sound image is formed owing to the difference in the quality of tone.

The digital filter operation is executed by one digital filter means. Due to this operation, the tone is diffracted by, or transmits through, the head to form a sound image in the vertical direction for one ear. The digital filter operation is executed by another digital filter means (FIG. 5). Due to this operation, the sound image is formed in the vertical direction for the other ear. Further, the data subjected to the digital filter operation and the data that is not operated are synthesized at a predetermined distribution ratio to form a horizontal or a vertical sound image. When the distribution ratio (A, K, L) is changed, the position of the sound image moves (FIGS. 6, 13, 14 and 9).

Particular sound images in the horizontal direction and in the vertical direction are subjected to the digital filter operation corresponding to both human ears. The results of digital filter operations are weighted and synthesized, and a sound image in the above other direction is formed depending upon the ratio of weighting (FIG. 10). The digital filter means of the above one channel forms counterbalance sound components of the above one channel, which are sent as subtraction components to the other sound system where they are subtracted from the other sound data and are canceled (FIG. 19). Thus, excess sound/tone components, which are not desired for forming a stereophonic sound image, are erased.

BRIEF DESCRIPTION OF THE DRAWINGS

FIG. 7 is a diagram illustrating filter coefficients stored in a program/data storage unit 4;

FIG. 15 is a diagram illustrating filter coefficients, level coefficients I, J, and delay coefficient DT stored in the program/data storage unit 4;

FIG. 18 is a diagram illustrating the filter coefficients p, q, r, s, t, u, v, w, x, y and z stored in the program/data storage unit 4;

DESCRIPTION OF THE PREFERRED EMBODIMENTS

1. Outline of the Embodiments

Figure 5:
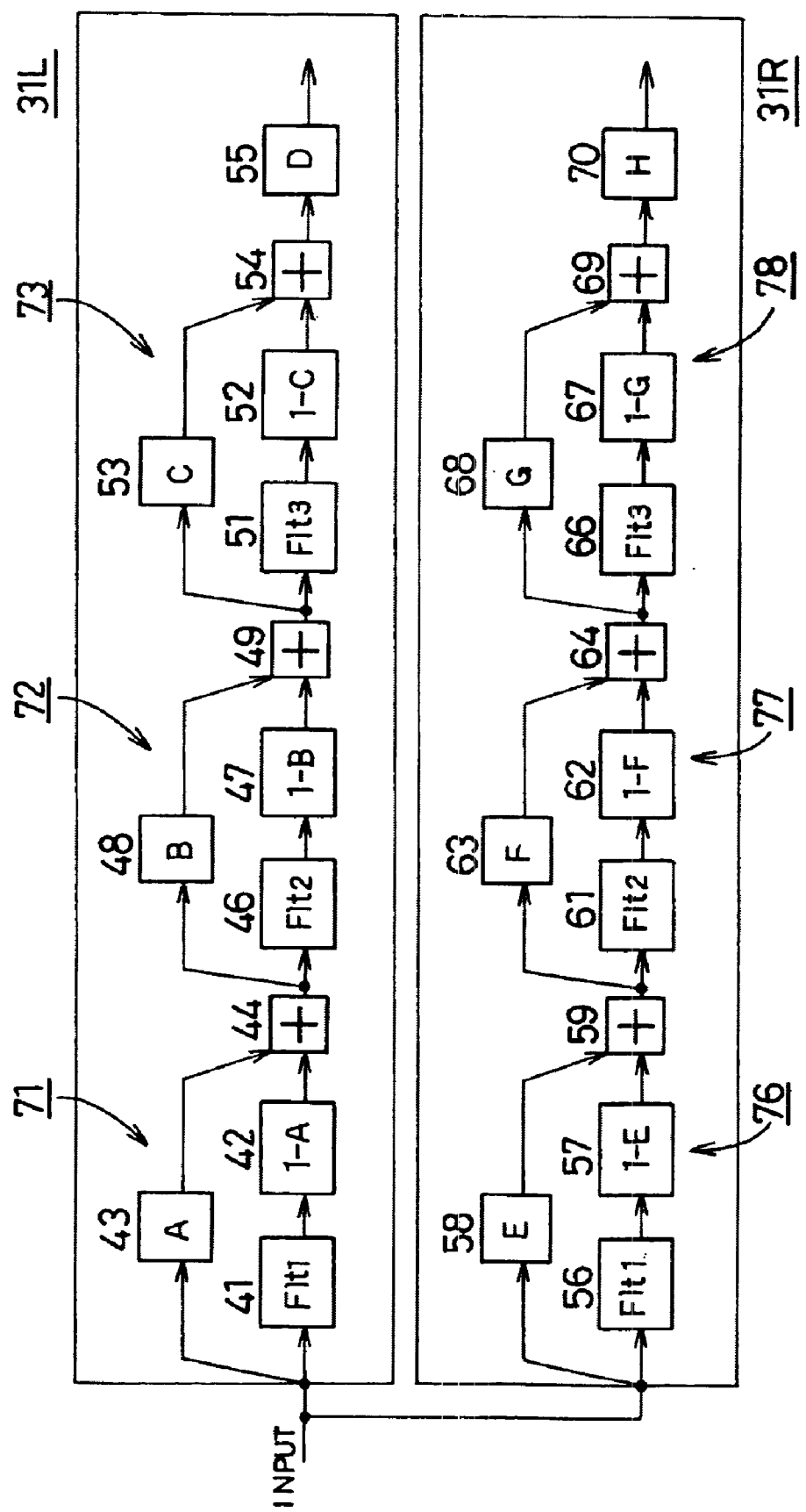
FIG. 5 is a diagram illustrating a vertical characteristics circuit 31L and a vertical characteristics circuit 31R.
Figure 9:
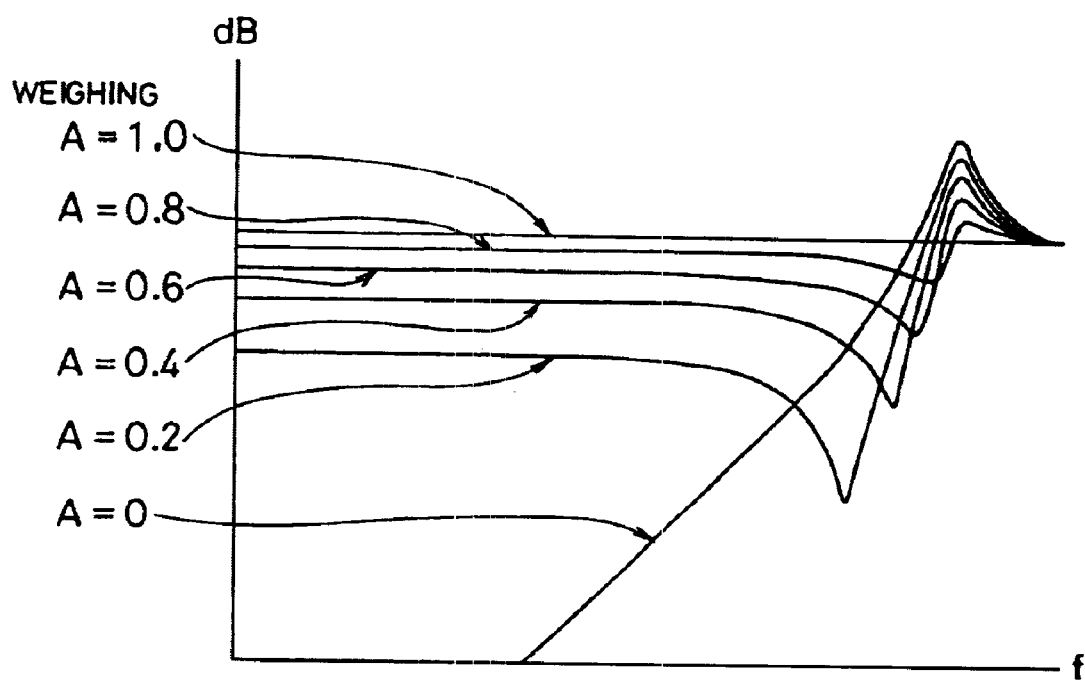
FIG. 9 is a diagram illustrating changes in the filter characteristics (frequency characteristics, decay characteristics and resonance characteristics) of the digital filter 41 (46, 51, 56, 61 and 66) for a change in the filter coefficient A, B, C, E, F and G)
Figure 12:
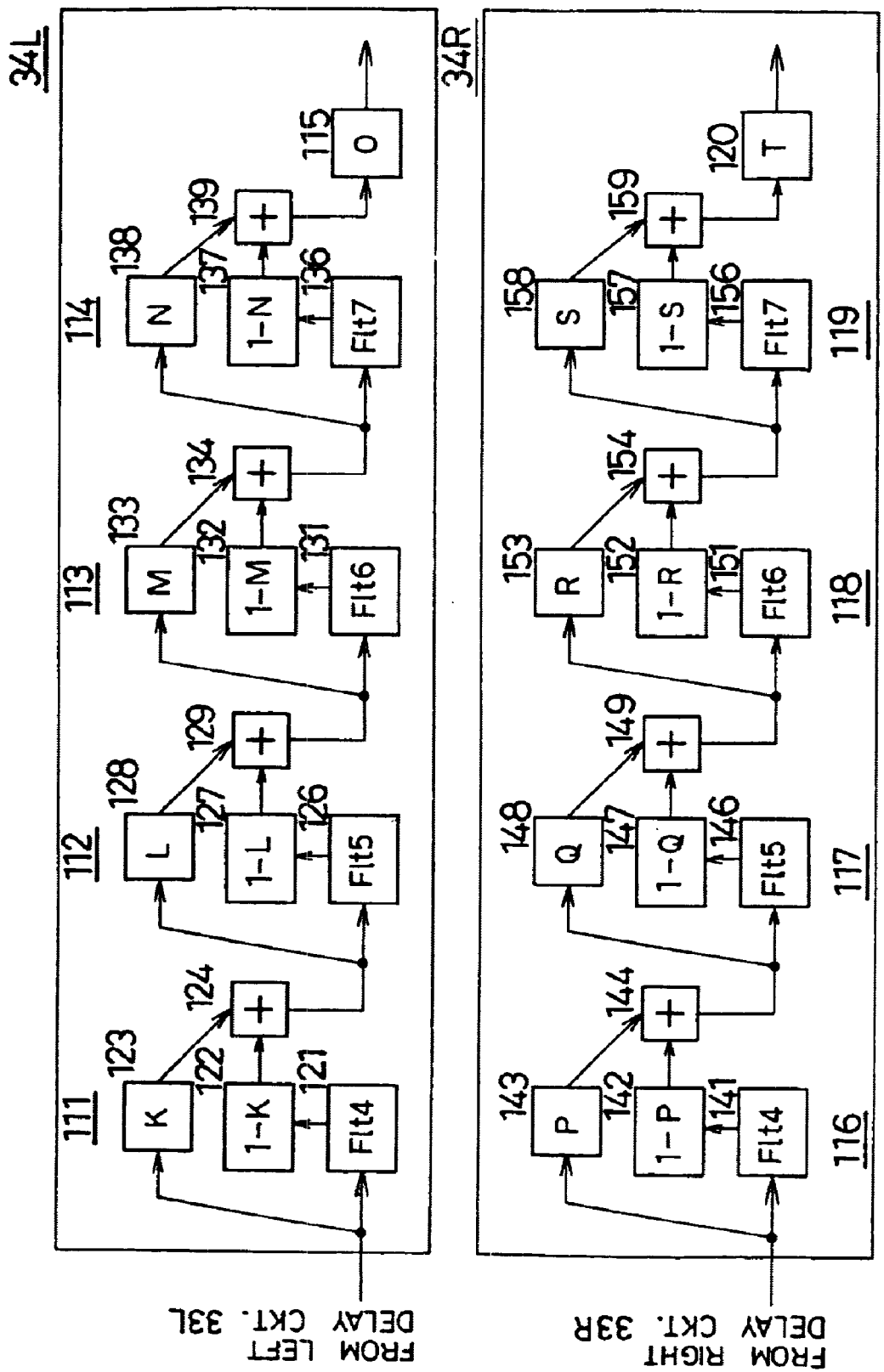
FIG. 12 is a diagram illustrating a left horizontal characteristics circuit 34L and a right horizontal characteristics circuit 34R.

Data subjected to the digital filter operation and data not subjected to the digital filter operation are synthesized at predetermined distribution ratios K and 1-K by a digital filter 121, multipliers 123, 122 and an adder 124. These data are executed for the right and left channels to form a horizontal or a vertical sound image (FIGS. 5 and 12). A change in the distribution ratio is accompanied by a movement of the sound image position (FIG. 9). The movement of the sound image is divided into frequency bands characteristic to the filter distribution circuits 111 to 119 and 71 to 78, and are further executed even for the filter coefficients K to T and A to H.

The sound image in a particular vertical direction that serves as a reference is subjected to the filter measurement corresponding to both human ears to calculate a filter coefficient. The filter coefficient is fed to a digital filter 41. The data subjected to the digital filter operation and the data that are not operated are synthesized at predetermined distribution ratios A and 1-A through the digital filter 41, multipliers 42, 43 and an adder 44. These data are executed for the right and left channels to form a vertical sound image. A change in the distribution ratio is accompanied by the movement of the sound image position in the vertical direction (FIG. 9). The movement of the sound image is divided into frequency bands characteristic to the filter distribution circuits 71 to 78, and are further executed even for the filter coefficients A to H.

Figure 17:
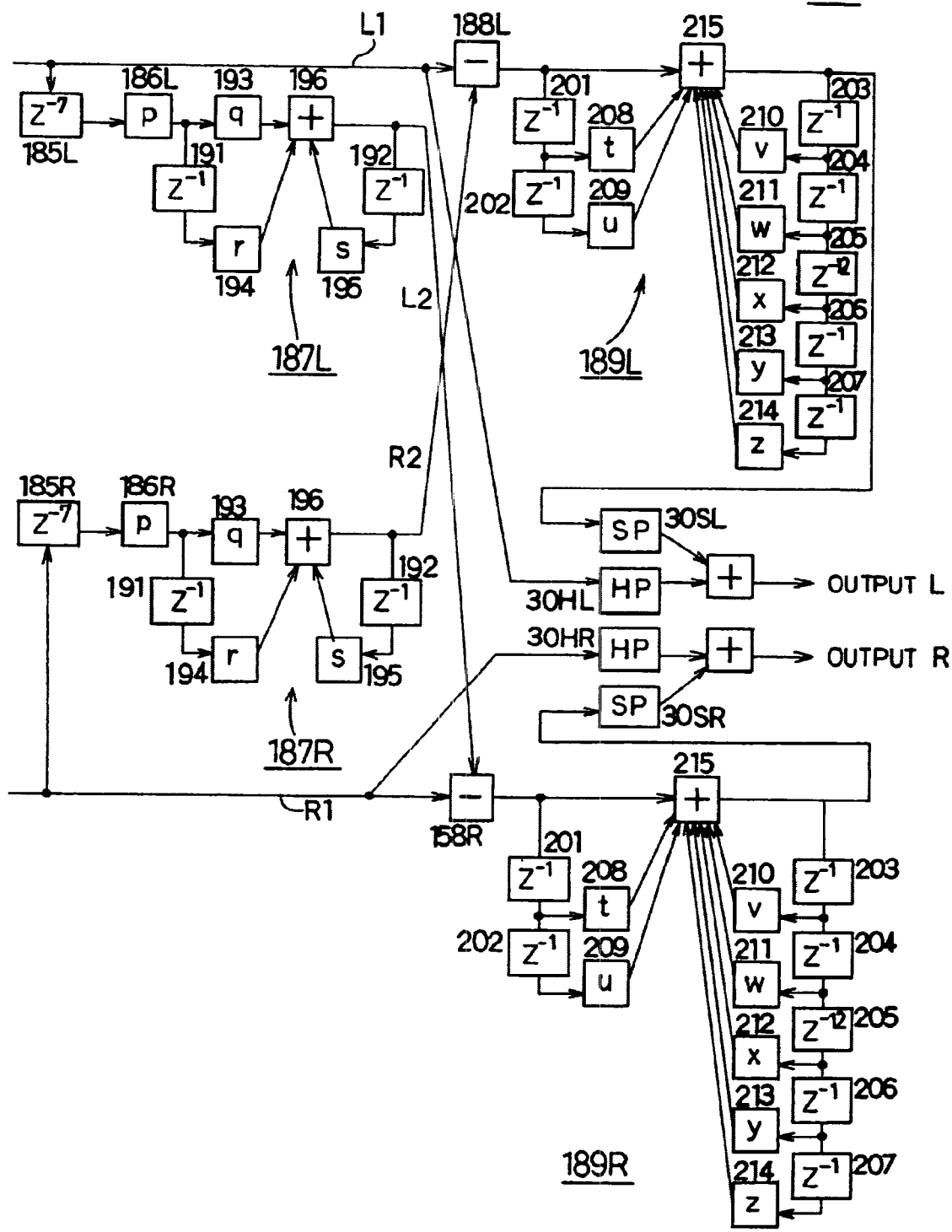
FIG. 17 is a diagram illustrating a crosstalk canceling circuit 35.

In a crosstalk cancel circuit 35 of FIG. 17, a right counterbalance sound component R2 is formed by a cancel digital filter 187R, sent to a left subtractor 188L, subtracted from the Left sound (L1) of the left horizontal characteristics circuit 34L, and the waveform of the subtracted left sound (L1–R2) is formed by a wave-forming circuit 189L and is sounded from the left speaker 30SL. The cancel digital filter 187R executes the digital filter operation to form a counterbalance sound component R2. The digital filter operation corresponds to a change by which the right sound is diffracted by, or transmits through, the head to arrive at the left ear.

1. While Circuitry.

Figure 1:
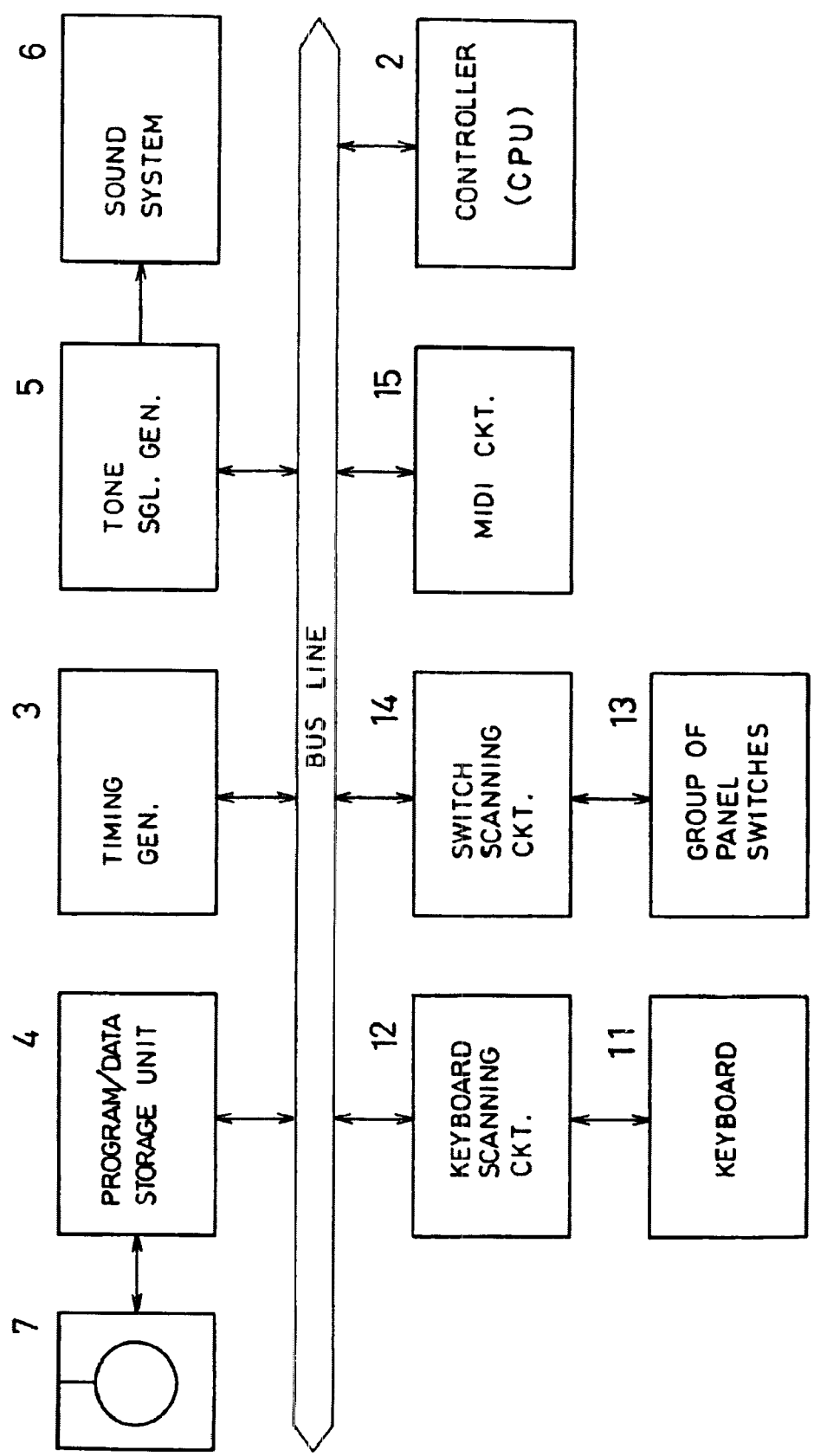
FIG. 1 is a diagram illustrating the whole circuitry of an electronic sound apparatus or an electronic musical instrument incorporating a stereophonic device or for realizing a stereophonic method.

FIG. 1 is a diagram illustrating the whole circuitry of an electronic sound apparatus or an electronic musical instrument incorporating a stereophonic device or for realizing a stereophonic method. The sounding on and sounding off of a tone are instructed by the keys of a keyboard 11 The keys are scanned by a key scanning circuit 12, whereby the data that represents key on or key off is detected and is written by a controller 2 into a program/data storage unit 4. The data is compared with the data representing the on or off of the keys that have been stored in the program/data storage unit 4, and the on event or off event of the keys is determined by the controller 2.

Every key of the keyboard 11 is provided with a step touch switch, the scanning is effected for every step switch, and on event/off event is detected for every head on/off of every step switch. The step switch generates the touch data, i.e., an initial touch data and an after-touch data that represent the speed and strength of touch.

The keyboard 11 comprises a lower keyboard, an upper keyboard and a pedal keyboard to generate tones of different timbres, i.e., to generate tones having different musical waveforms or different envelop waveforms. Tones of two timbres can be sounded simultaneously by a key-on of the upper keyboard. The keyboard 11 may be replaced by that of an electronic string instrument, electronic wind instrument, electronic percussion (pad) or computer keyboard.

The switches in a group of switches 13 are scanned by a switch scanning circuit 14. Due to the scanning, the data representing on and off of the switches are detected and are written by the controller 2 into the program/data storage unit 4. The data are compared with the data representing on and off of the switches that have been stored in the program/data storage unit 4, and on event and off event of the switches are determined by the controller 2. The sounded tone is that of manual play using the keyboard 11 or that of automatic play reproduced from the automatic performance information. The tones of the manual play or automatic play are also sent from a MIDI circuit 15.

The MIDI circuit 15 is an interface for transmitting and receiving tone data to and from an electronic musical instrument that is externally connected. The musical data comply with the MIDI (musical instruments digital interface) standards, and the tone is also generated based on these tone data.

The keyboard 11 or the MIDI circuit 15 also includes an automatic playing instrument. The play data (tone-generating data) generated by the keyboard 11, group of panel switches 13 and MIDI circuit 15, are for generating the tones. The manual play data of the keyboard 11 are written and stored in the program/data storage unit 4 as automatic play data. Through the MIDI circuit 15, the automatic play data are sent from other equipment, or the automatic play data in the program/data storage unit 4 are sent to other equipment.

The play data (tone-generating data) are musical factor data inclusive of tone pitch (tone pitch range) data (tone-determining factor), sounding time data, sound image data, field-of-play data, number-of-sounds data and resonance degree data. The sounding time data represent the passage of time from the start of sounding a tone. The field-of-play data represents part of play, part of tone, part of musical instrument, etc., and are corresponded to, for example, melody, background, chord, bass, rhythm, MIDI, etc., or are corresponded to an upper keyboard, a lower keyboard, a foot keyboard or a solo keyboard.

The tone pitch data are fetched as key number data KN. The key number data KN include octave data (tone pitch range data) and tone name data. The field-of-play data are fetched as part number data PN. The part number data PN distinguish the areas of play and are set depending upon the area of play of a tone that is sounded.

The sounding time data are fetched as tone time data TM, and are found from a flowchart that will be described later, and are based upon the time count data from a key-on event or are substituted by envelope phase. The sounding time data have been closely described in the specification and drawings of Japanese Patent Application No. 219324/1994 as data related to the passage of time from the start of sounding.

The sound image (stereo) data is fetched as sound image data SI, and is determined for their stereophonic sound image position. The sound image data SI is input from the group of panel switches 13 or from the MIDI circuit 15, or is stored in the automatic play data. The sound image data SI is added for every tone, or are added for every musical factors such as for every plural tones, for every timbre or for every field of play.

The sound image data SI has a value over a range of 0 to 360 degrees in the horizontal direction and over a range of from –90 degrees to +90 degrees in the vertical direction. The sound image data SI includes a value that changes depending upon the passage of time and a fixed value that does not change despite the time passes. A digital filter operation data (filter coefficient) is found from the sound image data SI, and a sound image is formed by the digital filter operation that will be described later.

The number-of-sounds data (concurrent number-of-sounds data SS) represents the number of tones that are concurrently sounded. For example, on/off data of an assignment memory 60 are based on the number of tone "1", which is found from the process of the flow charts that will be described later.

The resonance degree data (KD) represents the degree of resonance between a tone and another tone that are simultaneously generated. The resonance degree has a large value when a ratio of integers is small between a pitch frequency of the tone and a pitch frequency of another tone, and the resonance degree has a small value when a ratio of integers is great, as can be found by the processing using a flowchart as will be described later. The resonance degree data includes a consonance degree, consonance relation, harmonic degree, resonance degree, resonance relation and resonance contents of pitch and frequency of the tones simultaneously generated thereof.

The group of panel switches 13 is equipped with various switches inclusive of timbre tablet, effect switch, rhythm switch, pedal, wheel, lever, dial, handle and touch switch, which are for musical instruments. The pedal is a damper pedal, a sustain pedal, a mute pedal, a soft pedal, or a sostenuto pedal.

Tone control data are generated by these switches. The tone control data are musical factor data for controlling the tone that is generated, and include timbre data (timbre-determining factor), touch data (speed/strength of sounding instruction operation) number-of-sounds data, degree-of-resonance data, effect data, rhythm data, sound image (stereo) data, quantize data, modulation data, tempo data and envelop data. These musical factor data, too, are synthesized wish the play data (tone data) and are input through a variety of switches, and are further synthesized with the automatic play data or play data transmitted and received through the interface.

The timbre data are corresponded to the kinds of musical instruments (sounding media/sounding means) such as a keyboard instrument (piano, etc.), a wind instrument (flute, etc.), a stringed instrument (violin, etc.) and a percussion instrument (drum, pad) and are fetched as tone number data TN. The envelop data include an envelope speed ES, an envelope level EL, an envelope time ET and an envelope phase EF.

Such musical factor data are sent to a controller 2 where a variety of signals that will be described later, data and parameters are changed over to determine the content of the tone. The play data (tone-generating data) and tone control data are processed by the controller 2, a variety of data are sent to a tone signal generator 5, and a tone wave signal MW is generated. The controller 2 includes CPU, ROM and RAM.

The program/data storage unit 4 (internal storage medium/means) stores automatic play data that will be described later. The automatic play data includes a sounding start timing data and a kind-of-envelope data. The sounding start timing data is controlled based on the kind-of-envelope data.

The program/data storage unit 4 (internal storage medium/means) comprises a storage unit such as a ROM, a writable RAM, a flush memory or an EPROM, and in which can be written and stored (installed/transferred) a program of a computer stored in a data storage unit 7 external storage medium/means) such as an optical disk or a magnetic disk. In the program/data storage unit 4 are further stored (installed/transferred) programs transferred from an external electronic musical instrument or a computer through the MIDI circuit 15 or a transmitter/receiver. The program storage medium includes a communication medium.

The installation (transfer/copy) is automatically executed when the data storage unit 7 is set into the tone-generating apparatus or when the power source of the tone-generating apparatus is turned on, or is installed by the operation by an operator. The above-mentioned program corresponds to a flowchart that will be described later, with which the controller 2 executes a variety of processings.

The apparatus may store, in advance, another operating system, system program (OS) and other programs, and the above-mentioned program may be executed together with these OS and other programs. When installed in the apparatus (computer body) and is executed, the above-mentioned program executes the processings and functions described in the claims by itself or together with other programs.

Moreover, part or whole of the program may be stored in, and executed by, one or more apparatuses other than the above-mentioned apparatus, and the data to be processed and the data/program that have been processed already may be executed among the above-mentioned apparatus and other apparatuses through communication means in order to execute the present invention by the above-mentioned apparatus and by the other apparatuses as a whole.

In the program/data storage unit 4 are stored the above-mentioned musical factor data, the above-mentioned variety of data and various other data. These variety of data include data necessary for the time-division processing as well as data to be assigned to the time-division channels.

The tone signal generator 5 repetitively generates a tone wave signal MW for every part sound, and a sound system 6 generates sound. The rate for repetitively generating the tone wave signals MW varies depending upon the tone pitch data. Further, the waveform of the repetitively generated tone waveform signals MW is changed over depending upon the musical factor data such as the timbre data mentioned above. Relying upon the time-division processing, the tone signal generator 5 simultaneously forms a plurality of tone signals to generate a polyphonic sound.

The timing generator 3 outputs timing control signals to every circuit so that the whole circuitry of the tone-generating apparatus is maintained in synchronism. The timing control signal includes clock signals of all periods, as well as signals of a logical product or a logical sum of these clock signals, a channel clock signal CHφ having a period of a dividing-time of one channel in the time-division processing, a channel clock signal nCHφ having a frequency n (n=1, 2, 3, - - - ) times as large thereof, a channel number data CHNo, a channel number data nCHNo having an increment speed n (n=1, 2, 3, - - - ) times as large thereof, and a time count data TI.

The time count data TI represents the absolute time, i.e., the passage of the time. The period from a reset due to the overflow of :he time count data TI until a reset due to the next overflow, is set to be longer than the longest sounding time among various tones and is set, depending upon the cases, to be several times as great.

2. Tone Signal Generator 5.

Figure 2:
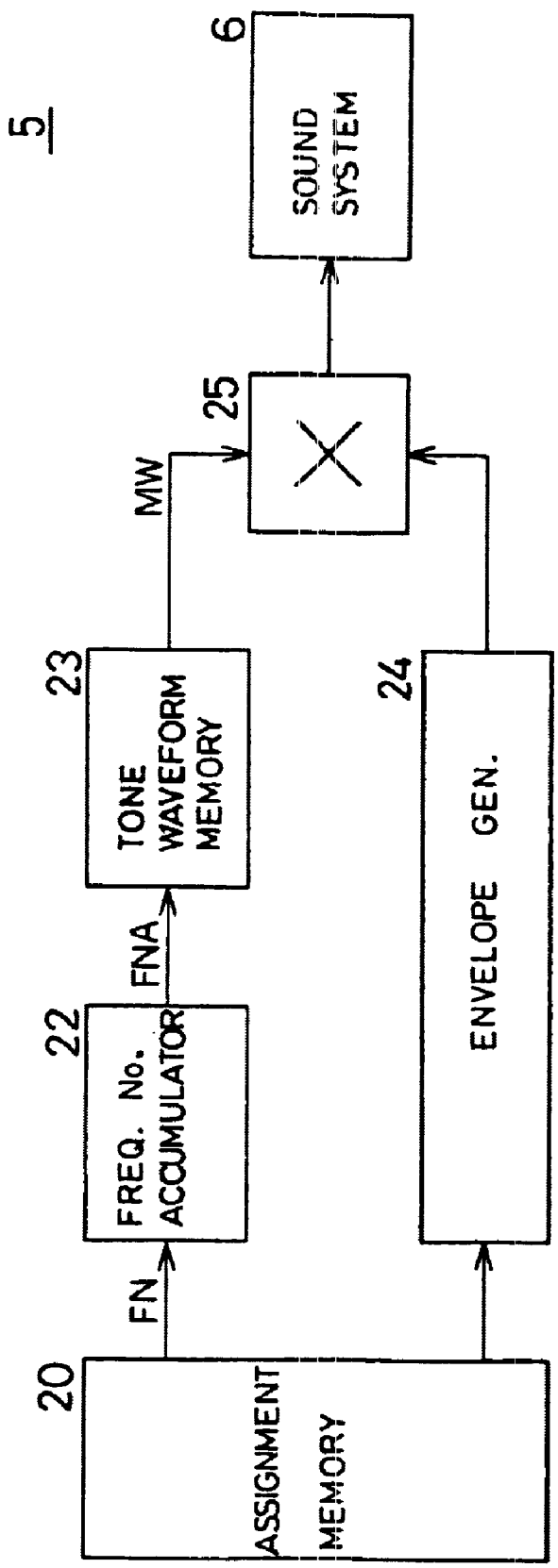
FIG. 2 is a diagram illustrating a tone signal generator 5.

FIG. 2 illustrates the tone signal generator 5. Musical factors such as key number data KN and tone number data TN of the channels read out from the assignment memory 20 are sent to he frequency number accumulator 22. The frequency number data FN corresponding to the key number data KN are accumulated in a time-dividing manner, and the accumulated frequency number data FNA are fed to the tone waveform memory 23 as address data in a time-dividing manner.

The tone waveform memory 23 stores a plurality of tone waveform data MW which are read out based on the accumulated frequency number data FNA in a time-dividing manner. The tone waveform data MW are selected based on the musical factors such as the tone number data TN or based on the selection operation by the operator using the group of panel switches 13.

The musical factors such as tone number data TN are read out from the assignment memory 20, sent to the frequency number accumulator 22, converted into bank data BK, and are fed as high-order read-out address data to the tone waveform memory 23. The low-order read-out address data are the above-mentioned accumulated frequency number data FNA.

The tone waveform data MW are sampling data having a waveform of an instrument sound such as of piano, violin, flute, cymbals, etc. The tone waveform data MW may vary depending upon the waveforms such as sine wave, sawtooth wave or rectangular wave, depending upon the content ratios of specific components such as harmonic components or noise components, depending upon the groups of spectral components based on specific formants, depending upon the kinds of whole waveforms from the sounding start to the sounding end, or depending upon the touch data TC and/or key scaling data KS.

The tone waveform data MW of simple shapes such as of sine waves, saw-tooth waves and rectangular waves can also be generated by a high-speed operation processing. Even complex waveforms can be generated by the high-speed operation processing, as a matter of course.

Musical factors such as the tone number data TN of the channels read out from the assignment memory 20 are sent to an envelope generator 24 which generates the envelope waveform data EN depending upon the tone number data TN, etc. in a time-dividing mariner. The envelope waveform data EN are multiplied by the tone waveform data MW read out from the tone waveform memory 23 through a multiplier 25, and are sent to the sound system 6 to be sounded.

3. Sound System 6.

Figure 3:
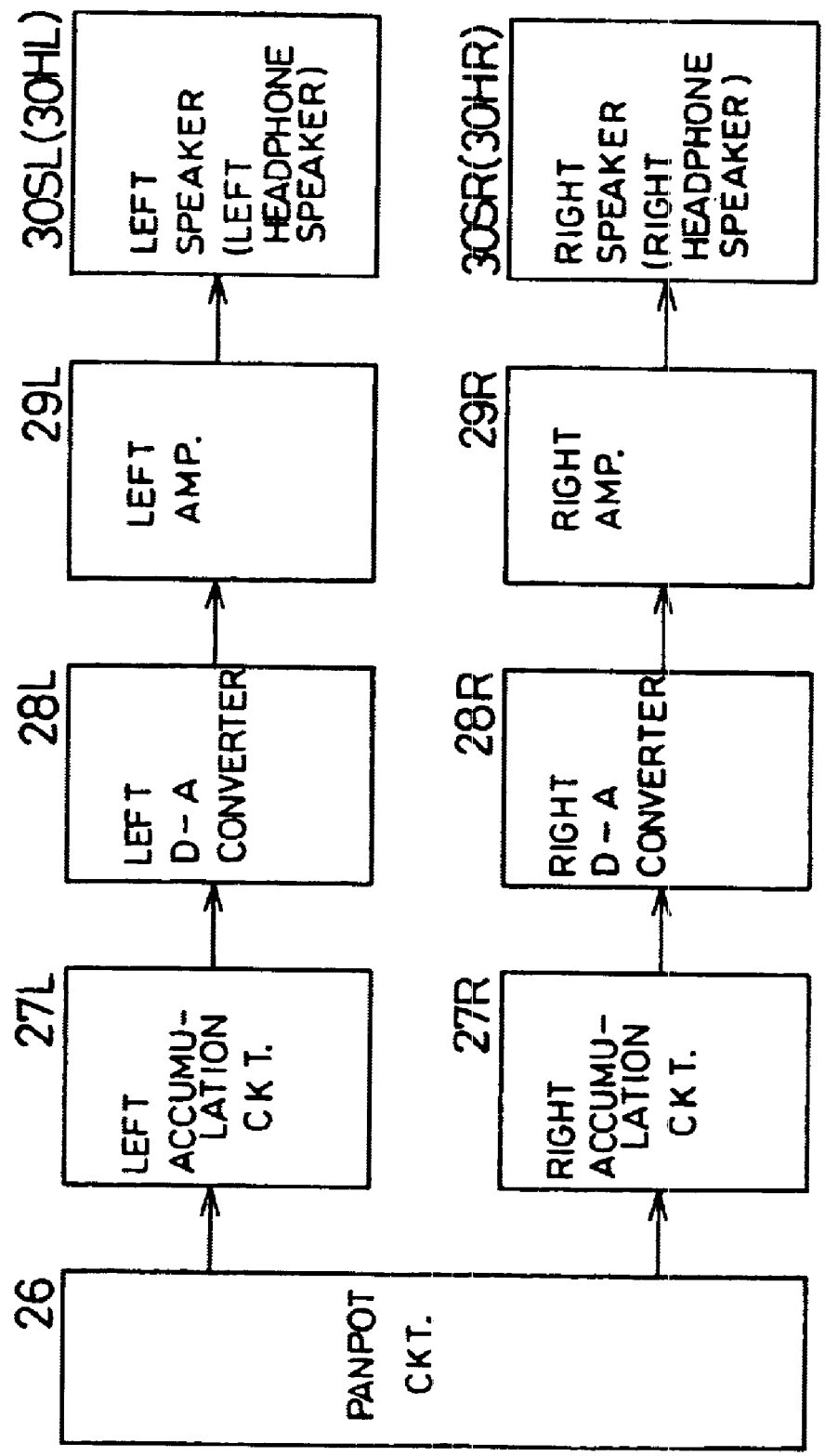
FIG. 3 is a diagram illustrating a sound system 6.

FIG. 3 illustrates tho sound system 6. The tone waveform data MW from the multiplier 25 are divided into tone waveform data MW of the right sound source and tone waveform data MW of the left sound source. The right and left tone waveform data are sounded from a right speaker 30SR (right headphone speaker 30HR) through a panpot circuit 26, a right accumulator 27R, a right D-A converter 28R and a right amplifier 29R, and are sounded from a left speaker 30SL (left headphone speaker 30HL) through apot circuit 26, a left accumulator 27L, a left D-A converter 28L and a left amplifier 29L.

The sound system constituted by the right speaker 30SR (right headphone speaker 30HR) through the right accumulator 27R, the right D-A converter 28R and the right amplifier 29R, is different from the one of constituted by the left speaker 30SL (left headphone speaker 30HL) through the left accumulator 27L, the left D-A converter 28L and the left amplifier 29L. These two sound systems form a stereophonic sound image and generate stereophonic sound. The right speaker 30SR and the left speaker 30SL are remote from the human ears. The right headphone speaker 30HR and the left headphone speaker 30HL are in the headphone or in the stereophonic earphone, and are disposed very close to the human ears.

The panpot circuit 26 is served with back-and-forth right-and-left sound image data SI read out from the assignment memory 20, and puts the back-and-forth right-and-left tone waveform data MW to the stereophonic control. The back-and-forth right-and-left sound image data SI also serve as two digital filter operation data (filter coefficient data). In the stereophonic control, the back-and-forth right-and-left tone waveform data MW are put to different digital filter controls simultaneously.

4. Panpot Circuit 26.

Figure 4:
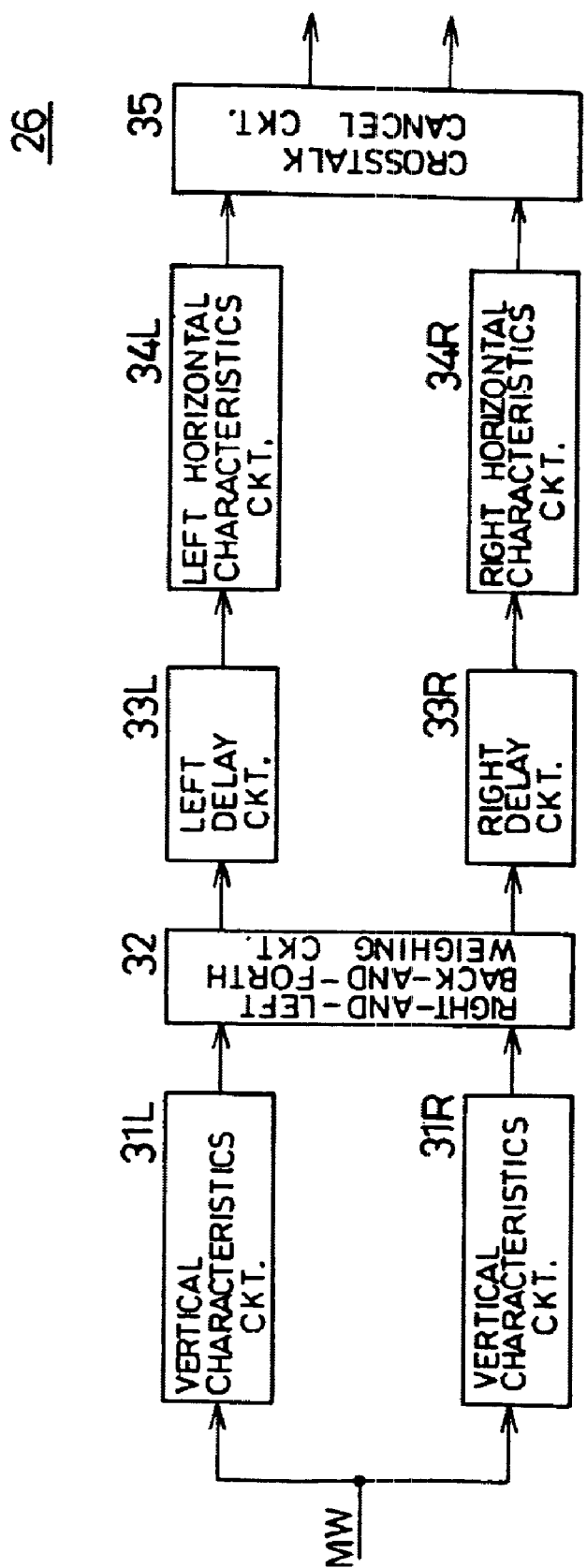
FIG. 4 is a diagram illustrating a panpot circuit 26.

FIG. 4 illustrates the panpot circuit 26. The tone waveform data MW from the multiplier 25 are input to a vertical characteristics circuit 31L (left) and to a vertical characteristics circuit 31R (right). Thus, the digital filter operation control is executed for forming the sound image in the vertical direction. Further, the tone waveform data MW are weighted by a right-and-left back-and-forth weighting circuit 32, and are determined for their ratio of distribution to the back-and-forth right-and-left directions. The tone waveform data MW are delayed through a left delay circuit 33L and a right delay circuit 33R, and are subjected to the digital filter operation control for forming the sound image in the horizontal direction through a left horizontal characteristics circuit 34L and a right horizontal characteristics circuit 34R. Further, excess signal components that are not needed for forming the sound image are canceled through a crosstalk cancel circuit 35, and are sent to a left accumulation circuit 27L and to a right accumulation circuit 27R.

The vertical characteristics circuit 31L (left), vertical characteristics circuit 31R (right), left horizontal characteristics circuit 34L and right horizontal characteristics circuit 34R execute the same digital filter operation processing; i.e., have only different filter coefficients to be supplied and execute the digital filter controls simultaneously and in parallel.

The vertical characteristics circuit 31L and the vertical characteristics circuit 31R receive a filter coefficient corresponding to the data in the vertical direction among the sound image data SI from the assignment memory 20, and execute the controls for forming the sound image in the vertical direction. The vertical characteristics circuit 31L (left) executes the digital filter operation of sound that enters into the left ear of a listener, and the vertical characteristics circuit 31R (right) executes the digital filter operation of sound that enters into the right ear of a listener.

The left horizontal characteristics circuit 34L and the right horizontal characteristics circuit 34R receive a filter coefficient corresponding to the data in the horizontal direction among the sound image data SI from the assignment memory 20, and execute the controls for forming the sound image in the front, in the right-and-left and back-and-forth directions.

The crosstalk cancel circuit 35 generates a counterbalance sound component for canceling the sound that reaches the left ear among the sounds of the right channel, adds it to the sound of the left channel, and feeds it to the left sound system so as to be sounded. Further, the crosstalk cancel circuit 35 generates a counterbalance sound component for canceling the sound reaching the right ear among the sounds of the left channel, adds it to the sound of the right channel, and feeds it to the right sound system so as tone sounded.

Therefore, of the sound of the right channel, only the sound reaching the right ear of the listener is validated, and the sound of the right channel does not reach the left ear. Similarly, further, of the sound of the left channel, only the sound reaching the left ear of the listener is validated, and the sound of the left channel does not reach the right ear.

The cancellation of such excess sound components is also executed for controlling the sound image in he vertical direction. Thus, of the sound produced by one of different sound systems, the sound reaching one ear is cancel ed and only the sound reaching the other ear is validated by the sound component produced by the other sound system.

When the stereophonically controlled tone waveform data MW are fed to the headphone, the above crosstalk cancel circuit 35 is not used. In this case, the tone waveform data MW from the left horizontal characteristics circuit 34l, and the right horizontal characteristics circuit 34R are directly sent to the left accumulation circuit 27L and to the right accumulation circuit 27R. Use of the headphone is determined by the controller 2 through the sensor or any other switch. Then, the gate is switched, and the tone waveform data MW from the left horizontal characteristics circuit 34L and the right horizontal characteristics circuit 34R are directly sent to the left accumulation circuit 27L and to the right accumulation circuit 27R without passing through the crosstalk cancel circuit 35.

5. Vertical Characteristics Circuit 31L (Left) and Vertical Characteristics (Circuit 313 (Right).

FIG. 5 is a diagram illustrating the vertical characteristics circuit 31L (left) and vertical characteristics circuit 31R (right). The tone waveform data MW from the multiplier 25 are sent to the right-and-left back-and-forth weighting circuit 32 through three stages of filter distribution circuits 71, 72, 73 and a multiplier 55. The filter distribution circuit 71 includes a digital filter 41, multipliers 42, 43 and an adder 44, the filter distribution circuit 72 includes a digital filter 46, multipliers 47, 48 and an adder 49, and the filter distribution circuit 73 includes a digital filter 51, multipliers 52, 53 and an adder 54.

The tone waveform data MW from the multiplier 25 is filtered and controlled through the digital filter 41 and is multiplied by a filter coefficient (1-A) through the multiplier 42. Further, the tone waveform data MW from the multiplier 25 is multiplied by a filler coefficient A through the multiplier 43, and is added and synthesized to the tone waveform data MW that has been multiplied by the filter coefficient (1-A) through the adder 44. Thus, the sound data put to the digital filter operation and the sound data not put to the digital filter operation are added up and synthesized together at a predetermined distribution ratio.

The filter coefficients A and (1-A) become necessarily "1" when added up and synthesized together. A change in the filter coefficient A is accompanied by a change in the ratio of synthesis or in the ratio of distribution of the sound component put to the digital filter control and the sound component not put to the digital filter control. A change in the filter coefficient A results in a change in the ratio of synthesizing the two sound data and, hence, in a change in the position of the stereophonic sound image that is formed.

The filter coefficient is found according to the following formula, $$A = \alpha \times \cos(2\pi \times SI/180 + \beta) + \gamma \times \cos(4\pi \times SI/180 + \delta) + \xi$$

where SI is a sound image data in the vertical direction or an angle (degrees) of the sound image in the vertical direction, $\alpha, \beta, \gamma, \delta$ and $\xi$ are positive or negative constants which may differ depending upon the filter coefficients A, B, C, D, E, F, G and H.

When the sound image data SI is 0 degree in the vertical direction, the filter coefficient A is 1.0. When the sound image data SI is +45 degrees in the vertical direction, the filter coefficient A is 0.2. When the sound image data SI is +90 degrees in the vertical direction, the filter coefficient A is 0.0. On the other hand, when the sound image data S is −45 degrees in the vertical direction, the filter coefficient A is 0.35. When the sound image data SI is −90 degrees in the vertical direction, the filter coefficient A is 0.175. The above characteristics hold even for other filter coefficients B and C, though the values differ slightly.

The tone waveform data MW filtered and controlled through these filter distribution circuits 71, 72 and 73 are controlled for their levels by the multiplier 55, and are sent to the above right-and-left back-and-forth weighting circuit 32. The multiplier 55 is supplied with a filter coefficient D.

The digital filters 41, 46 and 51 in these three stages of filter distribution circuits 71, 72 and 73 have different filtering characteristics, and have different frequency bands that are to be filtered and controlled, different decay characteristics that are to be filtered and controlled or different resonance characteristics. In these three stages of filter distribution circuits 71, 72 and 73, the amount of decay or the amount of resonance is controlled for three frequency bands in which the frequency characteristics change typically or greatly, or for the three frequency bands of low tone, middle tone and high tone.

Further, the value of the filter coefficients A and (1-A), B and (1-B) and C and (1-C) of the three stages of filter distribution circuits 71, 72 and 73, are partly the same or different from each other. Thus, the ratio of synthesis or the ratio of distribution of the sound component put to the digital filter control and the sound component not put to the digital filter control, differs for each of the frequency bards.

The other vertical characteristics circuit 31R is constituted in the same manner and works in the same manner, i.e., is constituted by filter distribution circuits 76, 77, 78 and a multiplier 70 which are the same as the above filter distribution circuits 71, 72, 73 and the multiplier 35. The filter distribution circuit 76 includes a digital filter 56, multipliers 57 and 58, and an adder 59. The filter distribution circuit 77 includes a digital filter 61, multipliers 62 and 63 and an adder 64. The filter distribution circuit 73 includes a digital filter 66, multipliers 67 and 68 and an adder 69. The filter distribution circuits 76, 77 and 76 have difference filter coefficients E and (1-E), F and (1-F), G and (1-G), and H. The multiplier 70 multiplies a filter coefficient H.

The filter coefficients A and E, B and F, C and C, and D and H fed to the vertical characteristics circuit 31L and the vertical characteristics circuit 31R, are different to some extent. Therefore, the vertical characteristics circuit 31L and the vertical characteristics circuit 31R execute digital filter operations which are not the same. This is because the vertical characteristics circuit 31L (left) controls the formation of sound image of sound that enters to the left ear of the listener, and the vertical characteristics circuit 31R (right) controls the formation of sound image of sound that enters to the right ear of the listener.

That is, even the sound Is the same from the same sound source having the same horizontal and vertical directions, the frequency characteristics of the sound differs depending upon the sound reaching the right ear and the sound reaching the left ear. This difference causes a difference in the values of the filter coefficients A and E, B and F, C and G, and D and H. These filter coefficients, however, may have the same value. A change in the filter coefficients A, B, C, D, E, F, G and H causes a change in the position of the stereophonic sound image in the vertical direction.

These two vertical characteristics circuit 31L (left) and the vertical characteristics circuit 31R (right) execute the same digital filter operation processing according to the same formula; i.e., only the filter coefficients that are fed are different, and the digital filter control operations are executed digital filter controls simultaneously and in parallel 6. Digital Filters 41, 46, 51, 56, 61 and 66.

Figure 6:
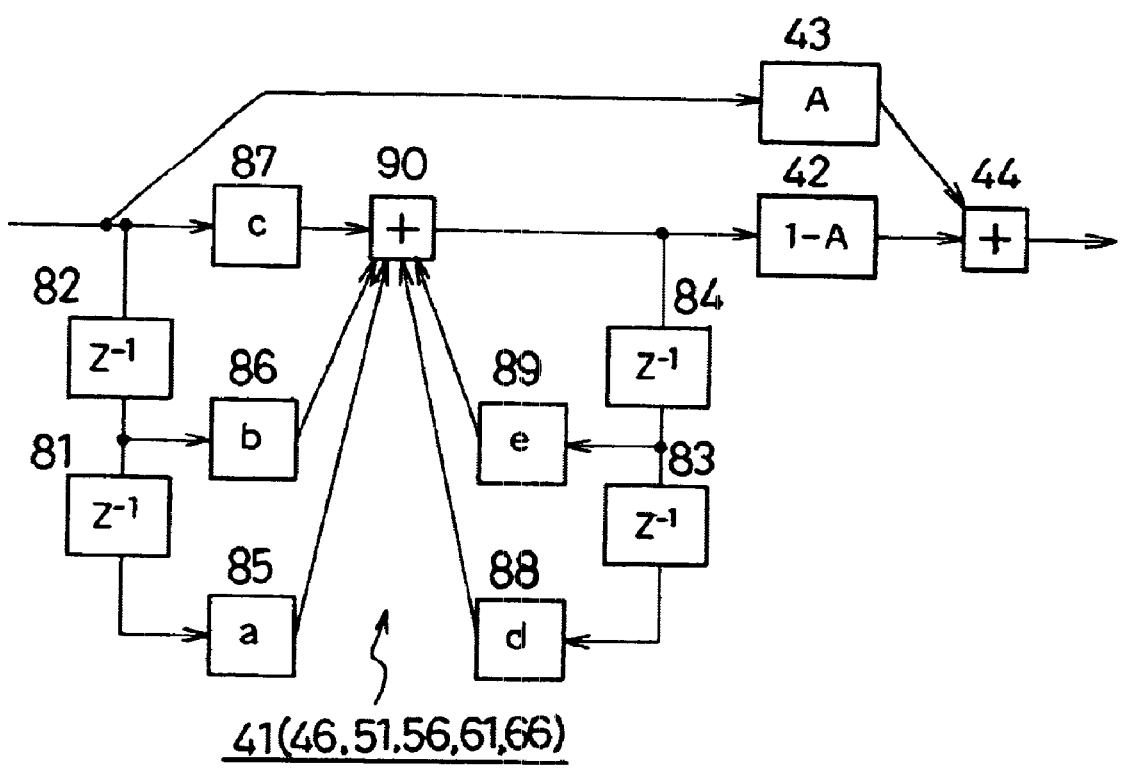
FIG. 6 is a diagram illustrating one of digital filters 126, 131, 146 and 151.

FIG. 6 illustrates any one of the digital filters 41, 46, 51, 56, 61 and 66. Described here is the digital filter 41. The digital filter 41 is of the second IIR zero point moving type.

The filter, however, may be of the FIR type. The digital filters 41 and 56, 46 and 61, and 51 and 66 are supplied with the same filter coefficients, and execute the same digital filter operations and exhibit the same digital filter characteristics. They may be different, as a matter of course.

The tone waveform data MW are multiplied by a filter coefficient c through a multiplier 87, and are sent to an adder 90. The tone waveform data MW are, further, delayed through a delay unit 82, multiplied by a filter coefficient b through a multiplier 86, and are sent to an adder 90. Further, the tone waveform data MW are delayed through delay units 82 and 81, multiplied by a filter coefficient a through a multiplier 85, and are sent to the adder 90.

The tone waveform data MW synthesized through the adder 90 are delayed through a delay unit 84, multiplied by a filter coefficient e through a multiplier 89, and are sent to the adder 90. The tone waveform data MW synthesized through the adder 90 are delayed through delay units 84 and 83, multiplied by a filter coefficient d through a multiplier 88, and are sent to the adder 90 so as to be synthesized by feedback. The delay amounts of the delay units 81, 82, 83 and 84 are the same as the sampling period for sampling the digital tone waveform data MW, or are integer times as great, or arc the ones divided by an integer.

7. Filter Coefficient for Controlling the Vertical Sound Image.

FIG. 7 illustrates filter coefficients stored in the program/data storage unit 4. There are six sets of filter coefficients a, b, c, d and e for the digital filters 41, 46, 51, 56, 61 and 66. The values of the six sets of filter coefficients a, b, c, d and e are different for each of the digital filters. They, however, may be the same, as a matter of course.

As shown in FIG. 7, the six sets of filter coefficients a, b, c, d and e, as well as the filter coefficients A and (1-A), B and (1-B), C and (1-C), E and (1-F), F and (1-F), G and (1-G), D and H, are stored in many kinds in the program/data storage unit 4. The filter coefficient corresponding to the sound image data SI in the vertical direction is read out by the controller 2, and is fed to the vertical characteristics circuit 31L and to the vertical characteristics circuit 31R. Here, though not diagramed, the vertical characteristics circuit 31L and the vertical characteristics circuit 31R of FIG. 5 are provided with many latches for storing the filter coefficients.

A set of filter coefficients a, b, c, d and e have the same value in a range where the sound image data SI are from 0 degree to +90 degrees in the vertical a direction. The filter coefficient s a, b, c, d and 2 have the same value in a range where the sound image data SI are from 0 degree to −90 degrees in the vertical direction. They, however, may not be the same, as a matter of course. However, the filter coefficients a, b, c, d and e have different values depending upon whether the sound image is on the positive side, i.e., on the upper side or on the negative side, i.e., on the lower side.

The sets of filter coefficients a, b, c, d and e of the digital filters 41 and 56, 4(6 and 61, and 51 and 66, are determined, i.e., the two sets of filter coefficients a, b, c, d and e of the right and left channels, are determined in a manner as described below.

The digital filter operation is executed by the filter coefficients of the left digital filters 41, 46 and 51, and the frequency characteristics of the sound from the specified sound image are realized for the sound that reaches the left ear being diffracted by, or passing through, the human head or ear. Further, the digital filter operation is executed by the filter coefficients of the right digital filters 46, 51 and 56, and the frequency characteristics of the sound from the specified sound image are realized for the sound that reaches the right ear being diffracted by, or passing through, the human head or ear.

Thus, the digital filter operations corresponding to the two human ears are executed for the sound image in the particular horizontal and vertical directions. The specified sound image is in the particular horizontal and vertical directions, e.g., ±0 degree in the vertical direction and 90 degrees in the horizontal direction. The specified sound image position may be different from the above, as a matter of course.

When the filter coefficients A, B, C, D, E, F, G and H are varied, the position of the stereophonic sound image changes in the vertical direction. That is, due to the digital filter operation using the filter coefficients, the frequency characteristics of the sound that is diffracted by, or passed through, the human head or ear are realized for the sound of before being diffracted or transmitted. In this case, the position of the sound image of before the diffraction or transmission is ±0 degrees in the vertical direction and 0 degree in the horizontal direction, i.e., i s on the horizontal front plane. The specified sound image position may he different from the above, as a matter of course.

These filter coefficients are stored, input and are read out for every musical factor data, or are selected and read out depending upon the musical factor data that is fed. Therefore, the position of the sound image that is formed varies depending upon a change in the above-mentioned tone pitch (tone pitch range) data (tone pitch-determining factor), sounding time data, sound image data, field-of-play data, number-of-sounds data, resonance degree data, timbre data timbre-determining factor), touch data (speed/strength of sounding instruction operation), effect data, rhythm data, quantize data, modulation data, tempo data and envelope data.

8. Filter Characteristics for Controlling the Vertical Sound Image.

Figure 8:
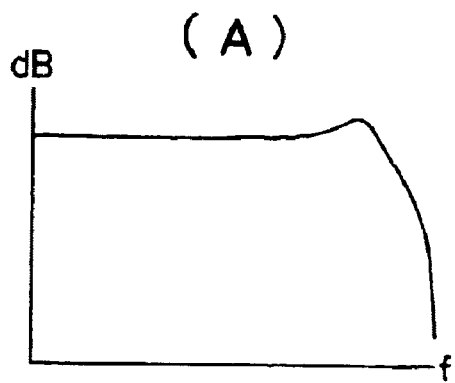
FIG. 8 is a diagram illustrating filter characteristics, i.e., frequency characteristics, decay characteristics and resonance characteristics of digital filters 41, 46, 51, 56, 61 and 66.
Figure 8:
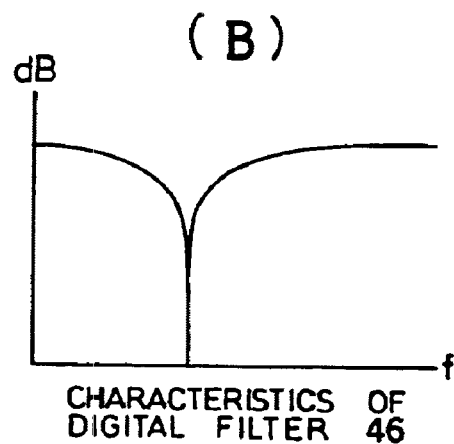
Figure 8:
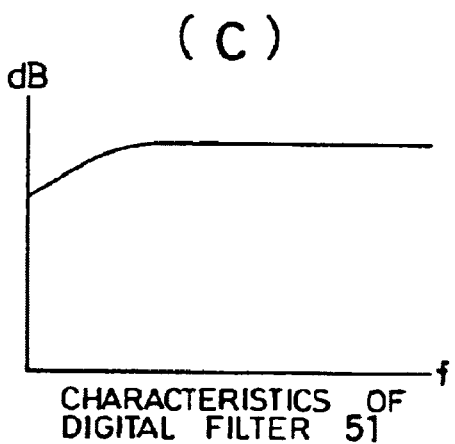
Figure 8:
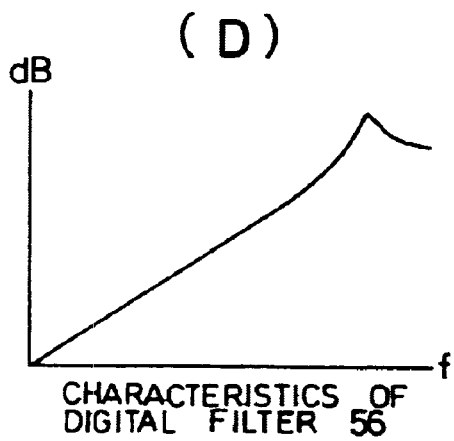
Figure 8:
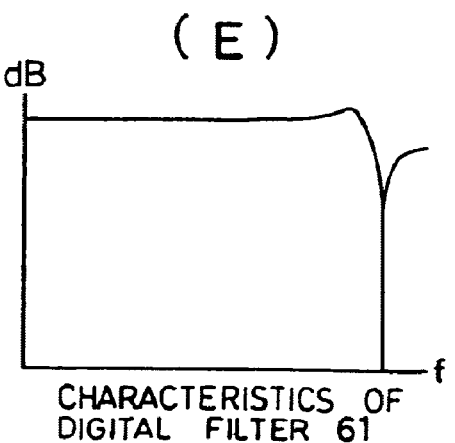
Figure 8:
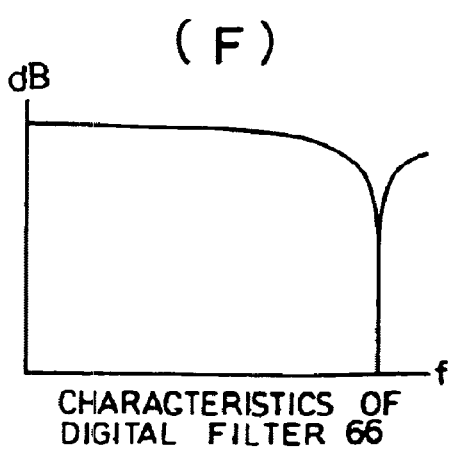

FIG. 8 is a diagram illustrating filter characteristics, i.e., frequency characteristics, decay characteristics and resonance characteristics of the digital filters 41, 46, 51, 56, 61 and 66. Digital filter operations are executed by the digital filters 41, 46, 51, 56, 61 and 66 relying on the above-mentioned six sets of filter coefficients a, b, c, d and e, and on the filter coefficients A and (1-A), B and (1-B), C and (1-C), E and (1-E), F and (1-F), G and (1-G), D and H, and the sound image position or the sound image characteristics are realized and controlled in the vertical direction. Due to the above six sets of filter coefficients a, b, c, d and e, the characteristics of FIGS. 8(A), 8(B), 6(C), 6(D), 8(E) and 8(F) are realized in FIG. 8, the ordinate represent the value of the gain (amount of decay, level) and the abscissa represents the value of the frequency.

In this example, the digital filters 41, 46 and 51 in the vertical characteristics circuit 31L contain more harmonic components than the digital filters 56, 61 and 66 in the vertical characteristics circuit 31R. This however, may be reversed, as a matter of course. At other sound image positions, the filter characteristics change gradually.

Such filter characteristics are really found by measurement. The sound to he measured is generated toward a binaural microphone (dummy head microphone) from every direction of sound image. In this case, the frequency bands of sound being measured cover the whole frequency bands. However, the frequency bands may be three bands of low tone, middle tone and high tone, and the sounds of these three bands may be sounded toward the binaural microphone from each direction of the sound image. The binaural microphone (dummy head microphone) has the shape of a human head equipped with human ears, and having microphones provided at positions of both ears.

The sound to be measured is generated being divided into predetermined angles, such as 1 degree, 5 degrees, 10, degrees, 20 degrees, 45 degrees or 90 degrees in the vertical direction from −90 degrees through up to +90 degrees, and the difference in the frequency characteristics is found between the sound collected by the binaural microphone and the sound that is generated. A filter coefficient is calculated for realizing the frequency characteristics of this difference. There has heretofore been known a method of finding a filter coefficient from the frequency characteristics.

Thus, the frequency characteristics are measured depending upon the diffraction and transmission of sound through the human head and ears in the horizontal direction, vertical direction, right-and-left direction, back-and-forth direction, up-and-down direction or in inclined directions among them of the human head and ears, and the filter coefficients are found corresponding to the above directions. Then, the result of digital filter operation corresponding to the sound reaching the left ear and the result of digital filter operation corresponding to the sound reaching the right ear, are synthesized together through the right-and-left back-and-forth weighting circuit 32, and the stereophonic sound image is formed in the right-and-left and in the back-and-forth directions.

The thus found filter coefficients are stored in the program/data storage unit 4 as shown FIG. 7. In this case, the digital filter 41 in the vertical characteristics circuit 31L and the digital filter 56 in the vertical characteristics circuit 31R are regarded to constitute a single digital filter, and a filter coefficient thereof is calculated. The digital filter 46 in the vertical characteristics circuit 31L and the digital filter 61 in the vertical characteristics circuit 31R are regarded to constitute a single digital filter, and a filter coefficient thereof is calculated. The digital filter 51 in the vertical characteristics circuit 31L and the digital filter 66 in the vertical characteristics circuit 31R are regarded to constitute a single digital filter, and a filter coefficient thereof is calculated.

Depending upon the cases, the filter distribution circuits 72, 73, 77 and 78 are omitted, and the digital filters 46, 51, 61 and 66 are omitted, too. Depending upon the cases, further, either the vertical characteristics circuit 31L or the vertical characteristics circuit 3IR is omitted. In these cases, the differences are in agreement between the filter characteristics of FIG. 8 and the frequency characteristics of the sound collected by the binaural microphone and of the sound that is generated.

9. Changes in the Filter Coefficients A, B. C, E, F and G.

FIG. 9 illustrates changes in the filter characteristics (frequency characteristics, decay characteristics and resonance characteristics) of the digital filter 41 (46, 51, 56, 61 and 66) for a change in the filter coefficient A (B, C, E, F, G). When the filter coefficient A is 0, the filter control is effected for all tone waveform data MW that are input.

As the filter coefficient A gradually approaches "1", the component ratio of the input tone waveform data MW subjected to the filter control decreases, and a change in the frequency characteristics decreases over the whole frequency. Besides, the resonance frequency (resonance point) moves. Such a change corresponds to a chance in the value of he stereophonic sound image data SI, and the position of the stereophonic sound image chances in the vertical direction.

10. Right-and-left Back-and-forth Weighting Circuit 32.

Figure 10:
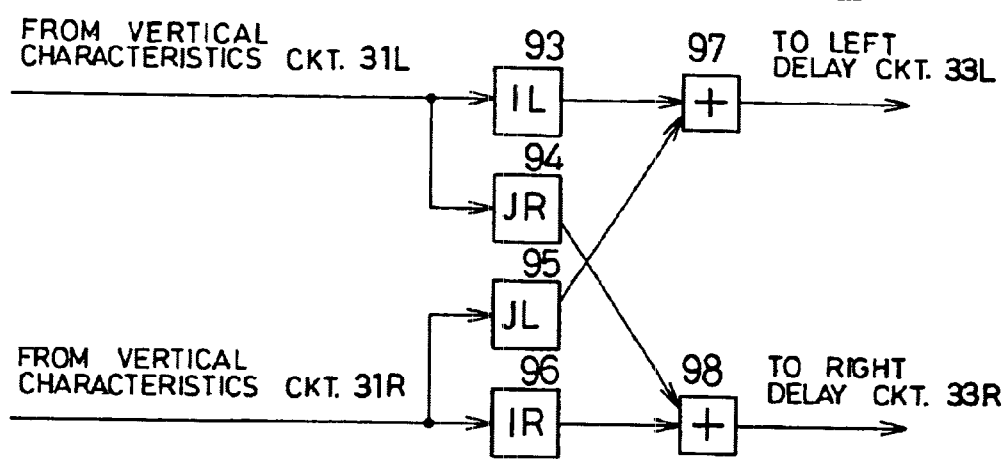
FIG. 10 is a diagram illustrating a right-and-left, front and rear weighting circuit 32.

FIG. 10 illustrates the right-and-left back-and-fourth weighting circuit 32. The tone waveform data MW from the vertical characteristics circuit 31L are multiplied by a level coefficient I through a multiplier 93, are sent to a multiplier 97, are multiplied by a Level coefficient J through a multiplier 94, and are sent to an adder 98. The tone waveform data from the vertical characteristics circuit 31R are multiplied by a level coefficient J through a multiplier 95, are sent to he adder 97, are multiplied by a level coefficient I through a multiplier 96, and are sent to the adder 98. The synthesized output of the adder 97 is sent to the left delay circuit 33L, and the synthesized output of the adder 98 is sent to the right delay circuit 33R.

The level coefficients I and J are stored in the program/data storage unit 4, the level coefficient corresponding to the sound image data SI in the horizontal direction is read by the controller 2 and is fed to the multipliers 93, 94, 95 and 96. Though not diagramed, the right-and-left back-and-forth weighting circuit 32 of FIG. 9 is provided with many latches for storing the level coefficients.

The level coefficients I, J are found according to the following formulas, $$I = 0.5 + SIh/180 \quad (0 \leq SIh \leq 90)$$
$$I = 1.5 - SIh/180 \quad (90 < SIh \leq 270)$$
$$I = -1.5 + SIh/180 \quad (270 < SIh < 360)$$
$$J = 1 - I$$

where SIh is a sound image data in the right-and-left and back-and-forth directions and represents the angle (degrees) of the sound image in the right-and-left back-and-forth horizontal directions. In this case the relation of "j" and "I" is "I+J=1".

When the sound image data SIh is 0 degree (front) in the horizontal direction, the level coefficients are I–0.5 and J=0.5. When the sound image data SIh is +90 degrees (extreme left) in the horizontal direction, the level coefficients are I=1 and J=0. When the sound image data SIh is +180 degrees (back) in the horizontal direction, the level coefficients are I=0.5 and J=0.5. When the sound image data SIh is +270 degree (extreme right) in the horizontal direction, the level coefficients are I=0 and J=1.

This means that the specified sound image in the vertical characteristics circuit 31L and in the vertical characteristics circuit 31R is at +90 degrees in the horizontal direction. Accordingly, the digital filter operation Us executed by the vertical characteristics circuit 31 and by the vertical characteristics circuit 31R, the tone waveform data MW equipped with sound image in the vertical direction are weighted and synthesized, to form a sound image in the other horizontal and vertical directions.

When, for example, the sound image data SIh is at +90 degrees extreme left) in the horizontal direction, the level coefficients are I=1 and J=0. When the sound image data SIh is +270 degrees (extreme right) in the horizontal direction, the level coefficients are I=0 and J=1. The values of level coefficients I and J are just exchanged at the symmetrical sound image positions. Therefore, the symmetrical sound image is formed when the results of digital filter operations of the vertical characteristics circuit 31L and of the vertical characteristics circuit 31R are symmetrically inverted.

Thus, the magnitudes of the right and left tone waveform data MW are controlled depending on the sound image data SIh in the horizontal direction. The magnitudes of sound data fed to the right and left sound system shows different values depending upon the position of the stereophonic sound image, and the stereophonic sound image that is formed is more emphasized and clarified.

Further, the result of digital filter operation of the left ear from the vertical characteristics circuit 31L and the result of digital filter operation of the right ear from the vertical characteristics circuit 31R, are weighted and synthesized together through the right-and-left back-and-forth weighting circuit 32 depending upon the sound image data SIh in the right-and-left horizontal direction. Thus, the right and left stereophonic sound images are further formed and added.

11. Right Delay Circuit 33 and Left Delay Circuit 33L.

Figure 11:
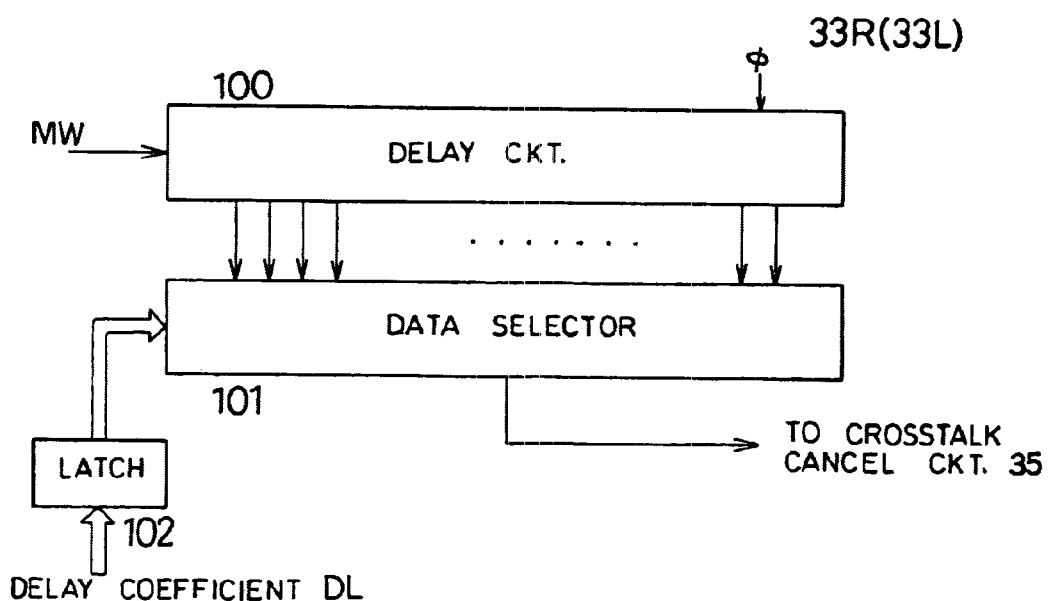
FIG. 11 is a diagram illustrating a right delay circuit 33R (left delay circuit 33L)

FIG. 11 illustrates the right delay circuit 33R or the left delay circuit 33L. The tone waveform data MW from the adder 97 or the adder 98 of the right-and-left back-and-forth weighting circuit 32 are input to a delay circuit 100, are successively shifted and are sent. The delay circuit 100 is constituted by CCD (charge-coupled device), and the tone waveform data MW that are input are successively shifted through the elements in response to clock signals φ that are input. The frequency of the clock signals φ is the same as the sampling frequency for sampling the tone waveform signals, or is an integer times as large thereof, or is as small as the one divided by an integer.

The outputs of the elements of the delay circuit 100 are selected through a data selector 101 and are sent to the crosstalk cancel circuit 35. The data selector 101 is served with delay coefficients DL through a latch 102.

The delay coefficient DL is stored in the program/data storage unit 4. The delay coefficient DL corresponding to the sound image data SI in the horizontal direction is read by the controller 2, and is stored in the latch 102.

The delay coefficient DL is found in accordance with the following formulas, $$DL = ((U + V \times SIv) \times SIh) \times W$$
(when $0 < SIh \leq 90$)
$$DL = (X + (Y \times SIv) + (U + V \times SIv) \times SIh) \times W$$
(when $90 < SIh \leq 180$)
$$DL = (X + (Y \times SIv) + (U + V \times SIv) \times (360 - SIh)) \times W$$
(when $180 < SIh \leq 270$)
$$DL = ((U + V \times xSIv) \times (360 - SIh) \times W$$
(when $270 < SIh \leq 360$)

where SIv is a sound image data in the vertical direction and represents an angle (degrees) of the sound image in the vertical direction, SIh is a sound image data in the right-and-left back-and-forth horizontal direction and represents an angle (degree) of the sound image in the right-and-left back-and-forth horizontal direction, and U, V, W, X and Y are positive or negative constants.

Phases or start timings of the sound data fed to the right and left sound systems have values that differ depending upon the positions of the stereophonic sound images, and the stereophonic sound image that is formed is more emphasized and clarified.

12. Left Horizontal Characteristics Circuit 34L and Right Horizontal Characteristics Circuit 34R.

FIG. 12 illustrates the left horizontal characteristics circuit 34L and the right horizontal characteristics circuit 34R. The tone waveform data MW from the left delay circuit 33L are sent to the crosstalk cancel circuit 35 through four stages of filter distribution circuits 111, 112, 113, 114 and a multiplier 115. The filter distribution circuit 111 includes a digital filter 121, multipliers 122 and 123, and an adder 124. The filter distribution circuit 112 includes a digital filter 126, multipliers 127 and 128, and an adder 129. The filter distribution circuit 113 includes a digital filter 131, multipliers 132 and 133, and an adder 134. The filter distribution circuit 114 includes a digital filter 136, multipliers 137 and 138, and an adder 139.

The tone waveform data MW from the left delay circuit 33L are put to the filter control through the digital filter 121, and are multiplied by a filter coefficient (1-K) through a multiplier 122. The tone waveform data MW from the left delay circuit 33L are multiplied by a filter coefficient K through a multiplier 123, and are added and synthesized with the tone waveform data MW that are multiplied by the filter coefficient (1-K) through the adder 124.

When added and synthesized together, the filter coefficients K and (1-K) become necessarily "1". A change in the filter coefficient K is accompanied by a change in the ratio of synthesis or a change in the distribution of the sound component put to the digital filter control and the sound component not put to the digital filter control. A change in the filter coefficient K causes a change in the ratio of synthesis and distribution of the two sound data, and causes a change in the position of the stereophonic sound image that is formed.

The filter coefficients K, L, M, N and O are found according to the following formulas, $$K = \mu \times \cos(\pi \times SI/180 + \upsilon) + \xi \times$$
$$\cos(2\pi \times SI/180 + \rho) + \sigma$$
$$L = \mu \times \cos(2\pi \times SI/90 + \upsilon)$$

where SI is a sound image data in the back-and-forth right-and-left horizontal direction and represents an angle (degree) of the sound image in the right-and-left horizontal direction, and μ, ν, ξ, η and τ are positive or negative constants that differ depending upon the filter coefficients K, L, M, N and O.

The filter coefficients P, Q, R, S and T are found according to the following formulas, $$P = \tau \times \cos(\pi \times (360 - SI)/180 + \upsilon) + \chi \times \cos$$
$$(2\pi \times (360 - SI)/180 + \phi) + \omega$$
$$Q = \tau \times \cos(2\pi \times (360 - SI)/90 + \upsilon)$$

where SI is a sound image data in the back-and-fourth right-and-left direction and represents an angle degree) of the sound image in the right-and-left horizontal direction, and τ, υ, χ, φ and ω are positive or negative constants that differ depending upon the filter coefficients P, Q, R, S and T.

When the sound image data SI is 0 degree (front) in the horizontal direction, the filter coefficient K is 0.34. When the sound image data SI is +90 degrees (extreme left) in the horizontal direction, the filter coefficient K is 0.85. When the sound image data SI is +180 degree (back) in the horizontal direction, the filter coefficient K is 0.12. On the other hand, when the sound image data SI is +270 degrees (extreme right) in the horizontal direction, the filter coefficient K is 0.26. The characteristics of change hold for other filter coefficients L, M, N, O, P, Q, R, S and T, too, but assuming values that are different to some extent.

The tone waveform data MW controlled through these filter distribution circuits 111, 112, 113 and 114 are controlled for their levels through a multiplier 115, and are sent to the crosstalk cancel circuit 35. A filter coefficient O is fed to the multiplier 115.

The digital filters 121, 126, 131 and 136 in these four stages of filter distribution circuits 111, 112, 113 and 114 have different filtering characteristics. This causes a difference in the frequency bands to be put to the filter control, and causes a difference in the decay characteristics or in the resonance characteristics to be put to the filter control. In the four stages of filter distribution circuits 111, 112, 113 and 114, the amount of decay or the amount of resonance is controlled for the three frequency bands where the frequency characteristics change typically or greatly, or for the four frequency bands of low tone, middle low tone, middle high tone and high tone.

The values of the filter coefficients K and (1-K), L and (1-L), M and (1-M) and N and (1-N) are not the same in these four stages of filter distribution circuits 111, 112, 113 and 114. Therefore, the ratio of synthesis or the ratio of distribution of the sound component put to the digital filter control and the sound component not put to the digital filter control, differs for each of the frequency bands.

The other right horizontal characteristics circuit 34R is similarly constituted and similarly works, i.e., constituted by filter distribution circuits 116, 117, 118, 119 and a multiplier 120 which are the same as the above-mentioned filter distribution circuits 111, 112, 113, 114 and the multiplier 115. The filter distribution circuit 116 includes a digital filter 141, multipliers 142 and 143, and an adder 144. The filter distribution circuit 117 includes a digital filter 146, multipliers 147 and 148, and an adder 149. The filter distribution circuit 118 includes a digital filter 151, multipliers 152 and 153, and an adder 154. The filter distribution circuit 119 includes a digital filter 156, multipliers 157 and 158, an,d an adder 159. The values of the filter coefficients P and (1-P), Q and (1-Q), R and (1-R) and S and (1-S) are not the same in the filter distribution circuits 116, 117, 118 and 119. A filter coefficient T is multiplied through a multiplier 120.

The values of filter coefficients K and P, L and Q, M and R, N and S, and O and T are symmetrical, and are fed to the right horizontal characteristics circuit 34R and to the left horizontal characteristics circuit 34L. Symmetrical digital filter operations are executed in the right horizontal characteristics circuit 34R and in the left horizontal characteristics circuit 34L. This is because the sound images are symmetrically formed by the right horizontal characteristics circuit 34R and by the left horizontal characteristics circuit 34L.

That is, when the sound is the same and the angle from the center is the same in the horizontal direction toward the right and the left, then, the frequency characteristics of sound reaching both ears are symmetrical. To meet this symmetry, the values of the filter coefficients K and P, L and Q, M and R, N and S, and O and T are symmetrical. However, the filter coefficients may assume the same value or may be asymmetrical. A change in the values of the filter coefficients K, L, M, N, O, P, Q, R, S and T is accompanied by a change in the position of the stereophonic sound image in the back-and-fourth right-and-left directions as described above.

These two right horizontal characteristics circuit 34R and the left horizontal characteristics circuit 34L execute the same digital filter operation according to the same formula; i.e., the supplied filter coefficients only are different, and the digital filter control operations are executed simultaneously and in parallel.

13. Digital Filters 121, 136, 141, 156.

Figure 13:
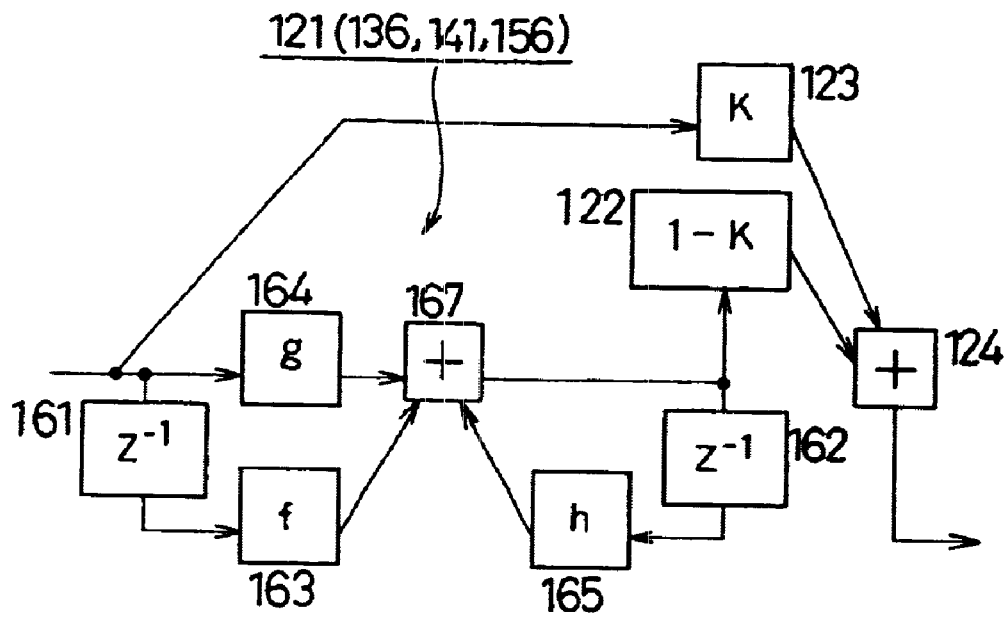
FIG. 13 is a diagram illustrating one of digital filters 121, 136, 141 and 156.

FIG. 13 illustrates one of the digital filters 121, 136, 141 and 156. Here, the digital filter 121 is described. The digital filter 121 is of the first IIR zero point moving type. The digital filter may be of the FIR type, as a matter of course. The digital filters 121 and 141, and 136 and 156 are served with the same filter coefficient to execute the same digital filter operation and, hence, to exhibit the same digital filter characteristics. They, however, may not be the same, as a matter of course.

The tone waveform data MW are multiplied by a filter coefficient g through a multiplier 164 and are sent to an adder 167. Similarly, the tone waveform data MW are delayed through a delay unit 161, multiplied by a filter coefficient f through a multiplier 163, and are sent to the adder 167.

The tone waveform data MW synthesized through the adder 167 are delayed through a delay unit 162, are multiplied by a coefficient h through a multiplier 165, and are sent to the adder 167 so as to be synthesized together by feedback. The amounts of delay through the delay units 161 and 162 are the same as the sampling period for sampling the digital tone waveform data MW, or are an integer times as large, or are as small as the one divided by an integer.

14. Digital Filters 126, 131, 146, 151.

Figure 14:
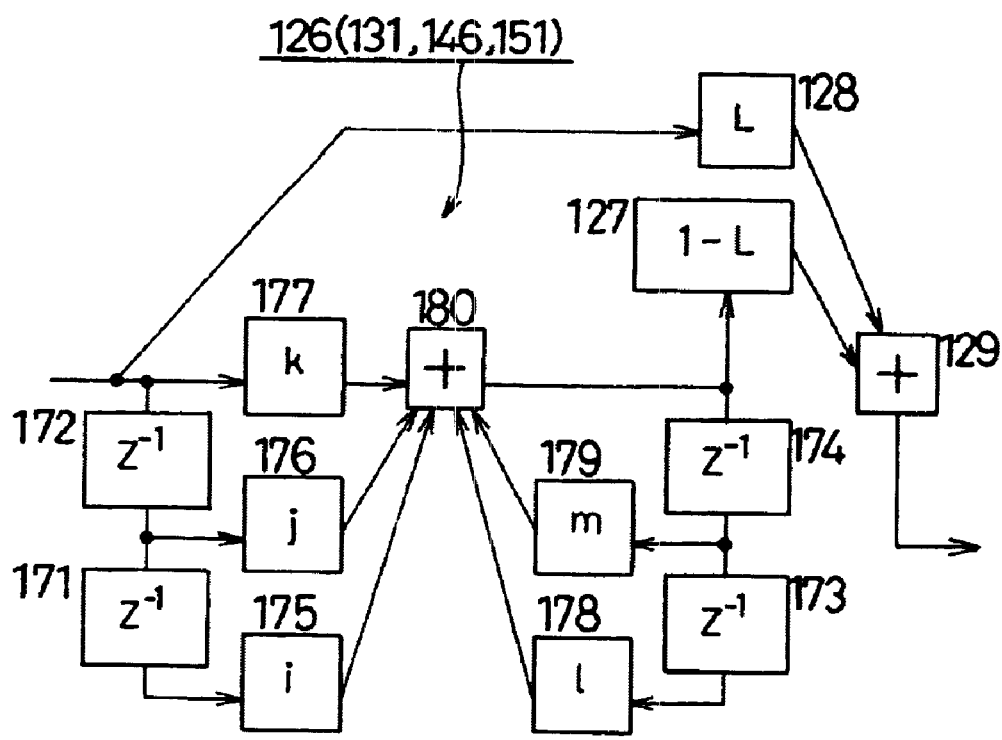
FIG. 14 is a diagram illustrating one of digital filters 126, 131, 146 and 151.

FIG. 14 illustrates one of the digital filters 126, 131, 146 and 151. Here, the digital filter 126 will be described. The digital filter 126 is of the second IIR zero point moving type. The filter, however, may be of the FIR type, as a matter of course. The digital filters 126 and 146, and 146 and 151 are supplied with the same filter coefficient, and execute the same digital filter operation and, hence, exhibit the same digital filter characteristics. They, however, may not be the same, as a matter of course.

The tone waveform data MW are multiplied by a filter coefficient k through a multiplier 177, and are sent to an adder 180. Similarly, the tone waveform data MW are delayed through a delay unit 172, multiplied by a filter coefficient j through a multiplier 176, and are sent to the adder 180. Similarly, the tone waveform data MW are delayed through delay units 172 and 171, multiplied by a filter coefficient i through a multiplier 175, and are sent to the adder 180.

The tone waveform data MW synthesized through the adder 180 are delayed through a delay unit 174, multiplied by a filter coefficient m through a multiplier 179, and are sent to the adder 180. The tone waveform data MW synthesized through the adder 180 are delayed through delay units 74 and 173, multiplied by a filter coefficient l through a multiplier 178, and are sent to the adder 180 where they are synthesized together by feedback. The amounts of delay through the delay units 171, 172, 173 and 174 are the same as the sampling period for sampling the digital tone waveform data MW, or are an integer times as large, or are as small as the one divided by an integer.

15. Filter Coefficients for Controlling the Back-and-forth Right-and-left Sound Image.

FIG. 15 illustrates filter coefficients, and the above-mentioned level coefficients I, J as well as the delay coefficient DT stored in the program/data storage unit 4. There are four sets of filter coefficients f, g and h for the digital filters 121, 136, 141 and 156. There are four sets of filter coefficients i, j, k, l and m for the digital filters 126, 131, 146 and 151. The values of the four sets of filter coefficients f, g, h, i, j, k, l and m are different depending upon the digital filters. They, however, may be the same, as a matter of course.

As shown in FIG. 15, the four sets of filter coefficients f, g, h, i, j, k, l and m, as well as the filter coefficients K and (1-K), L and (1-L), M and (1-M), N and (1-N), P and (1-P), Q and (1-Q), R and (1-R), S and (1-S), O and T, are stored in many kinds in the program/data storage unit 4. The filter coefficient corresponding to the sound image data SI in the back-and-forth right-and-left horizontal direction, is read by the controller 2, and is fed to the left horizontal characteristics circuit 34L and to the right horizontal characteristics circuit 34R. In this case, though not diagramed, the left horizontal characteristics circuit 34L and the right horizontal characteristics circuit 34R of FIG. 12 are provided with many latches for storing the filter coefficients.

The filter coefficients f, g, h, i, j, k, l and m of he above four sets all have the same value over a region where the sound image data SI is from 0 degree to +360 degrees. When the sound image is on the left side and on the right side, therefore, the filter coefficients f, g, h, i, j, k, l and m have the same value. They, however, may no be the same, as a matter of course.

Described below is how to determine the filter coefficients f, g, h, i, j, k, l and m of the sets of digital fitters 121 and 141, 126 and 146, 131 and 151, and 136 and 156, i.e., how to determine the filter coefficients f, g, h, i, j, k, l and m of the two sets of the right and left channels.

The digital filter operations are executed with filter coefficients of the digital filters 121, 126, 131 and 136 of the left side. Thus, there are realized frequency characteristics of the sound that has reached the left ear being diffracted by, or transmitting through, the human head or the ear with respect to the sound of specified sound image of before diffracted or transmitted. Further, the digital filter operations are executed with filter coefficients of the digital filters 141, 146, 151 and 156 of the right side. Thus, there are realized frequency characteristics of the sound that has reached the right ear being diffracted by, or transmitting through, the human head or the ear with respect to the sound of specified sound image of before diffracted or transmitted.

Thus, the digital filter operation corresponding to the two human ears is executed for the sound image in the particular horizontal and vertical directions. The specified sound image is in the particular horizontal and vertical directions, such as ±0 degree in the vertical direction and 90 degrees in the horizontal direction. A sound image position different from the above may be specified, as a matter of course.

A change in the values of the filter coefficients K, L, M, N, O, P, Q, R, S and T is accompanied by a change in the position of the stereophonic image in the back-and-fourth right-and-left horizontal directions as described above. That is, the digital filter operation using the filter coefficient makes it possible to realize frequency characteristics of the sound that is diffracted by, or has transmitted through, the human head or the ear with respect to the sound of before diffracted or transmitted. In this case, the position of the sound image of the sound of before diffraction or transmission is 0 degree in the horizontal direction and is ±0 degree in the vertical direction, i.e., is on the horizontal front plane. The position of the sound image different from the above may be specified, as a matter of course.

These filter coefficients, the level coefficients I, J, and the delay coefficient DT are stored, input and are read out for every musical factor data, or are selected and read out depending upon the musical factor data that is fed. Therefore, the position of the sound image that is formed varies depending upon a change in the above-mentioned tone patch (tone pitch range) data (tone pitch-determining factor), sounding time data, sound image data, field-of-play data, number-of-sounds data, resonance degree data, timbre data (timbre-determining factor), touch data (speed/strength of sounding instruction operation), effect data, rhythm data, quantize data, modulation data, tempo data and envelope data.

16. Filter Characteristics for Controlling the Back-and-forth Right-and-left Sound Image.

Figure 16:
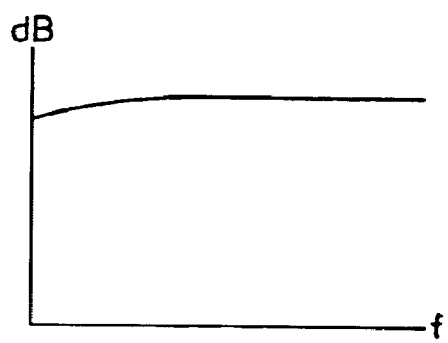
FIG. 16 is a diagram illustrating one of filter characteristics, i.e., frequency characteristics, delay characteristics and resonance characteristics of digital filters 121, 141, 126, 146, 131, 151, 136 and 156.
Figure 16:
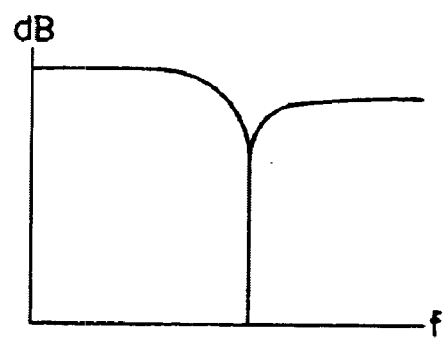
Figure 16:
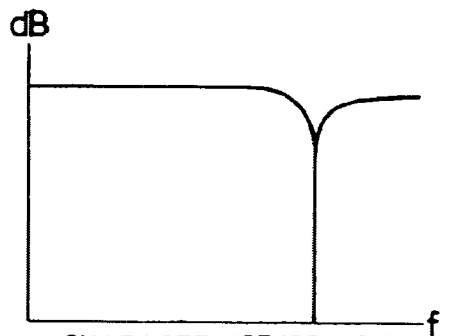
Figure 16:
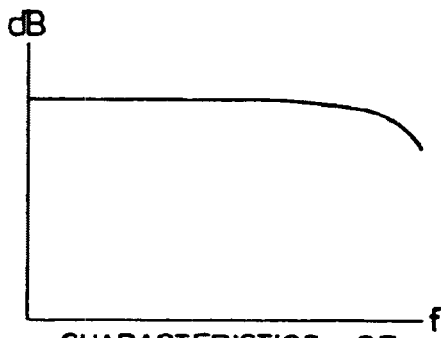

FIG. 16 illustrates filter characteristics, i.e., frequency characteristics, decay characteristics and resonance characteristics of the digital filters 121, 141, 126, 146, 131, 151, 136 and 156. The digital filter operations are executed through the digital filters 121, 141, 126, 146, 131, 151, 136 and 156 using the above-mentioned four sets of filter coefficients f, g, h, i, J, k, l, m and the above-mentioned filter coefficients K and (1-K), L and (1-L), M and (1-M), N and (1-N), P and (1-P), Q and (1-Q), R and (1-R), S and (1-S), O and T to control and realize the position of the sound image or the sound image characteristics in the back-and-forth and right-and-left directions. The characteristics of FIGS. 16(A), 16(B), 16(C) and 16(D) are realized using the above-mentioned four sets of filter coefficients f, g, h, i, j, k, l and m. In FIG. 16, the ordinate represents a value of the gain (amount of decay, level) and the abscissa represents a value of the frequency.

Here, the frequency characteristics of the digital filters 121, 126, 131 and 136 of the left horizontal characteristics circuit 34L are the same as the frequency characteristics of the digital filters 141, 146, 151 and 156 of the right horizontal characteristics circuit 34R. When the sound image data SI changes back and forth and right and left accompanying a change in the position of the stereophonic sound image, the filter coefficient that is read out differs depending upon it is on the right or on the left, and the frequency characteristics differ depending upon the right and the left.

Such filter characteristics are really found by measurement. The sound to be measured is generated toward the binaural microphone (dummy head microphone). Here, the frequency bands of the sound to be measured cover the whole frequency bands. The frequency bands, however, may be four bands of low tone, middle low tone, middle high tone, and high tone. The sound of these four bands is generated toward the binaural microphone from each direction of the sound image. The binaural microphone (dummy head microphone) has the shape of a human head equipped with human ears, and having microphones provided at positions of both ears.

The sound to be measured is sounded being divided into predetermined angles, such as 1 degree, 5 degrees, 10, degrees, 20 degrees, 45 degrees or 90 degrees in the horizontal direction from 0 degree through up to +360 degrees, and the difference in the frequency characteristics is found between the right and left sounds collected by he binaural microphone and the sound that is sounded. A filter coefficient is calculated for realizing the frequency characteristics of this difference. There has heretofore been known a method of finding a filter coefficient from the frequency characteristics.

Thus, the frequency characteristics are measured depending upon the diffraction and transmission of sound through the human head and ears in the horizontal direction, vertical direction, right-and-left direction, back-and-forth direction, up-and-down direction or in inclined directions among them of the human head and ears, and the filter coefficients are found corresponding to the above directions.

The thus found filter coefficients are stored in the program/data storage unit 4 as shown in FIG. 15. The filter distribution circuits 112, 113 and 114 may be omitted, and the digital filters 126, 131 and 136 may be omitted, too. FIG. 9 also shows changes in the filter characteristics (frequency characteristics, decay characteristics and resonance characteristics) of the digital filter 121 (126, 131, 136, 141, 146, 151, 156) for a change in the filter coefficient K (L, M, N, P, Q, R, S). When the filter coefficient K is 0, the filter control is effected for all tone waveform data MW that are input.

As the value of the filter coefficient K gradually approaches "1", on the other hand, the input tone waveform data MW are put at a decreased component ratio to the filter control, and the change in the frequency characteristics becomes small over the whole frequencies. The resonance frequency (resonance point) moves, too. This change complies with a change in the value of the stereophonic sound image data SI, and the position of the stereophonic sound image changes in the back-and-forth and right-and-left directions.

17. Crosstalk Cancel Circuit 35.

FIG. 17 is the crosstalk cancel circuit 35. The crosstalk cancel circuit 35 includes a seventh delay circuit 185L, a multiplier 186L, a cancel digital filter 187L, a subtractor 188L and a wave-forming circuit 189L. These circuits 185L, 186L, 187L, 188L, and 189L are provided in pairs 185R, 186R, 187R, 188R and 189R.

The left tone waveform data MW (L1) from the left horizontal characteristics circuit 34L are sent to the left headphone speaker 30HL and are sounded. The right tone waveform data MW (R1) from the right horizontal characteristics circuit 34R are sent to the right headphone speaker 30HR and are sounded.

Thus, when the headphone is used, the crosstalk cancel circuit 35 is switched over and is not used. This is because, the filter operations through the vertical characteristics circuit 31L, vertical characteristics circuit 31D, left horizontal characteristics circuit 34L, and right horizontal characteristics circuit 34R, are based on the characteristics of the binaural microphone. Therefore, no counterbalance sound component is required when the headphone is used.

The left tone waveform data MW (L1) from the left horizontal characteristics circuit 34L is delayed through the seventh delay circuit 185L, is controlled for its level by being multiplied by a filter coefficient p through the multiplier 186L, and a left counterbalance sound component L2 is formed by a cancel digital filter 187L and is sent to a right subtractor 188R. Through the right subtractor 188R, the left counterbalance L2 is subtracted from the right tone waveform data MW (R1) sent from the right horizontal characteristics circuit 34R. The subtracted right tone waveform data MW (R1) is formed through a wave-forming circuit 189R, and is sounded from the right speaker 30SR.

The right tone waveform data MW (R1) from the right horizontal characteristics circuit 34R is delayed through the seventh delay circuit 185R, is controlled for its level by being multiplied by a filter coefficient p through the multiplier 186R, and a right counterbalance sound component R2 is formed by a cancel digital filter 187R and is sent to the left subtractor 188L. Through the left subtractor 188L, the right counterbalance sound component R2 is subtracted from the left tone waveform data MW (L1) sent from the left horizontal characteristics circuit 34L. The subtracted left tone waveform data MW (L1) is formed by a wave-forming circuit 189L and is sounded from the left speaker 30SL.

When the right and left speakers 30SR and 30SL are used as described above, the crosstalk cancel circuit 35 is used so as to be changed over. This is because the filter operations through the vertical characteristics circuit 31L, vertical characteristics circuit 31D, left horizontal characteristics circuit 34L and right horizontal characteristics circuit 34R, are based or the characteristics of the binaural microphone. When the speakers are used, therefore, the counterbalance sound component is necessary.

Thus, the counterbalance sound component is sounded from one of the different sound systems. Therefore, of the sound generated from the other one of the different sound system, the sound reaching one ear is canceled, and only the sound reaching the other ear is validated. The counterbalance sound component is not generated when the sound from one sound system reaches one ear only but does not reach the other ear, like in such a sound system as headphone. The counterbalance sound component is generated when the sound from one sound system reaches not only one ear but also the other ear like a sound system using plural speakers. The counterbalance sound component is generated or not generated depending upon the sound system that is used.

The generation/non-generation of the counterbalance sound component is changed over based on the use of the headphone speakers 30HR and 30HL or on the use of the speakers 30SR and 30SL. Depending upon the cases, however, a switch is provided in a stage preceding the headphone speakers 30HR and 30HL or the speakers 30SR and 30SL. When the headphone speakers 30HR and 30HL are energized, therefore, the speakers 30SR and 30SL are de-energized. When the headphone speakers 30HR and 30HL are de-energized, on the other hand, the speakers 30SR and 30SL are energized.

The above switches are changed over when the connection terminals of the headphone are plugged into the apparatus. The turn on/of L of the switch is often detected by using a sensor. The sensor detects the connection terminals of the headphone that are plugged into the apparatus or that are removed therefrom. The detection data is sent to the controller 2, too.

The tone waveform data MW (L1), (R1) from the multipliers 186L and 186R are multiplied by a filter coefficient q through a multiplier 193 and are sent to an adder 196. Similarly, the tone waveform data MW (L1, R1) are delayed through a delay unit 191, are multiplied by a filter coefficient r through a multiplier 194, and are sent to the adder 196.

The tone waveform data MW synthesized through the adder 196 are delayed through a delay unit 192, are multiplied by a filter coefficient s through a multiplier 195, and are sent to the adder 196 so as to be synthesized together by feedback. The delay amounts through the delay circuits 185L, 185R and through the delay units 191, 192 are the same as the sampling period for sampling the digital tone waveform data MW, or are an integer times as large, or are as small as the one divided by an integer.

The tone waveform data MW (L1–R2), (R1–L2) from the subtractors 188L and 188R are delayed through a delay unit 201, are multiplied by a filter coefficient t through a multiplier 202, and are sent to an adder 215. Similarly, the tone waveform data MW (L1–R2), (R1–L2) are delayed through delay units 201, 202, are multiplied by a filter coefficient u through a multiplier 209, and are sent to the adder 215.

The tone waveform data MW synthesized through the adder 215 are delayed through a delay unit 203, are multiplied by a filter coefficient v through a multiplier 210, and are sent to the adder 215 so as to be synthesized together by feedback. The tone waveform data MW synthesized through the adder 215 are delayed through delay units 203, 204, are multiplied by a filter coefficient w through a multiplier 211, and are sent to the adder 215 so as to be synthesized together by feedback. The tone waveform data MW synthesized through the adder 215 are delayed through delay units 203, 204 and 205, are multiplied by a filter coefficient x through a multiplier 212, and are sent to the adder 215 so as to be synthesized together by feedback.

The tone waveform data MW synthesized through the adder 215 are delayed through delay units 203, 204, 205 an 206, are multiplied by a filter coefficient y through a multiplier 213, and are sent to the adder 215 so as to be synthesized together by feedback. The tone waveform data MW synthesized through the adder 215 are delayed through delay units 203, 204, 205, 206 and 207, are multiplied by a filter coefficient z through a multiplier 214, and are sent to the adder 215 so as to be synthesized together by feedback.

The output of the adder 215 is sent to the left (right) speaker 30SL (30SR) The delay amounts of the delay units 201, 202, 203, 204, 205, 206 and 207 are the same as the sampling period for sampling the digital tone waveform data MW, or are an integer times as large, or are as small as the one divided by an integer. The delay units 201, 202, 203, 204, 206 and 207 are the first, and the delay unit 205 is the twelfth.

The above-mentioned right accumulator 27R, right D-A converter 28R and right amplifier 29R are provided preceding the right speaker 30SR and the right headphone speaker 30HR. The above-mentioned left accumulator 27L, left D-A converter 28L and left amplifier 29L are provided preceding the left speaker 30SL and the left headphone speaker 30HL, which, however, are not shown in FIG. 17.

18. Filter Coefficients for Counterbalance Sound Components.

FIG. 18 illustrates the filter coefficients p, q, r, s, t, u, v, w, x, y and z stored in the program/data storage unit 4. The filter coefficients p, q, r, S, t, u, v, w, x, y and z are the same between the right and left systems, i.e., between the cancel digital filters 187L, 187R and between the wave-forming circuit 189L, 189R, but may be different.

Figure 19:
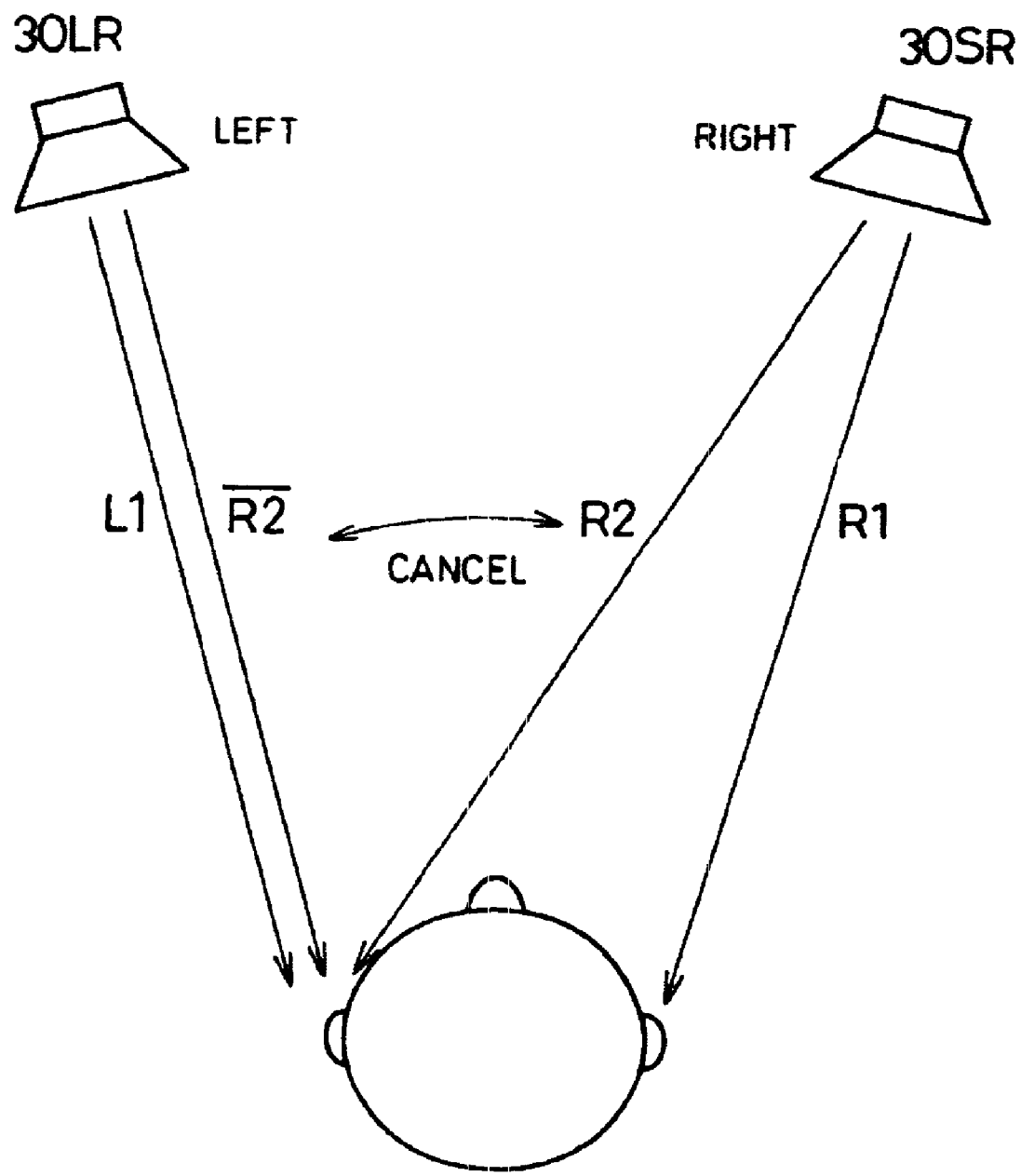
FIG. 19 is a view illustrating a state of offsetting excess sound R2 relying upon a counterbalance sound component R2 from the left speaker 30SL.

Such filter coefficients p, q, r, s, t, u, v, w, x, y and z, are found in a manner as described below. It is desired that the right sound R1 generated from a speaker, for example, From the right speaker 30SR in FIG. 19 reaches the right ear only. In practice, however, the right sound R1 is diffracted by, or transmits through, the human head or ear, and reaches the left ear as excess sound R2. A counterbalance sound component R2 is generated from the left speaker 30SL to cancel it. FIG. 19 illustrates the canceling by the counterbalance sound component R2. The same also holds for the canceling by the counterbalance sound component L2 of the opposite side, establishing a symmetrical relationship.

First, a difference in the frequency characteristics is found between the right sound R1 and the counterbalance sound component R2. The difference in the frequency characteristics is found for every position of the right and left speakers 30SR and 30SL and for every position of the listener. That is, the difference in the frequency characteristics is found for every angle of the head of the listener relative to the right and left speakers 30SR and 30SL. The filter coefficient is calculated for every angle to realize the frequency characteristics for every difference. The method of finding the filter coefficient from the frequency characteristics has been known.

The thus calculated filter coefficients become the above-mentioned filter coefficients p, q, r, s, t, u, v, w, x, y and z. The right and left speakers 30SR and 30SL are located at symmetrical positions. Therefore, the right and left filter coefficients p, q, r, s, t, u, v, w, x, y and z, assume the same values. However, when the listener is not present at a position of an equal distance from the right and left speakers 30SR and 30SL, or when the listener has different hearing abilities at his right and left ears, the values of the right and left filter coefficients differ.

Thus, the digital filter operation is executed for the sound generated from the right speaker 30SR, the digital filter operation being based on the difference in the frequency characteristics between the sound reaching the right ear from the right speaker 30SR and the sound reaching the left ear from the right speaker 30SR. The digital filter operation varies depending upon a change in the sound generated from the right speaker 30SR and is reaching the left ear being diffracted by, or transmitting through, the head. The result of operation is sounded from the left speaker 30SL as the counterbalance sound component. In this case, there is almost no change or a very small change in the frequency characteristics between the sound generated from the right speaker 30SR and the sound reaching the right ear.

Further, the digital filter operation is executed for the sound generated from the left speaker 30SL, the digital filter operation being based on the difference in the frequency characteristics between the sound reaching the left ear from the left speaker 30SL and the sound reaching the right ear from the left speaker 30SL. The digital filter operation varies depending upon a change in the sound generated from the left speaker 30SL and is reaching the right ear being diffracted by, or transmitting through, the head. The result of operation is generated from the right speaker 30SR as the counterbalance sound component. In this case, there is almost no change or a very small change in the frequency characteristics between the sound generated from the left speaker 30SL and the sound reaching the left ear.

The filter coefficients p, q, r, s, t, u, v, w, x, y and z are stored in many kinds in the program/data storage unit 4 as shown in FIG. 18 The filter coefficient corresponding to a relationship between the mutual positions of the right and left speakers 30SR, 30SL and/or the position of the listener, is read by the controller 2, and is fed to the crosstalk cancel circuit 35. In this case, though not diagramed, the crosstalk cancel circuit 35 of FIG. 17 is provided with many latches for storing the filter coefficients.

The value of the filter coefficient for operating he counterbalance sound component varies depending upon the relationship (angle) between the mutual positions of the sound systems and/or the position of the listener. The data of the mutual positions are input through switches in the group of panel switches 13, are sent :through the MIDI circuit 15, are read from the automatic play data, or are fed from a mechanism that detects the positions of the right and left speakers 30SL, 30SR and the position of the listener. The position detection mechanism may be slide position detection switching mechanisms provided under the slide-type right and left speakers 30SR and 30SL, or a laser reflector plate attached to the head of the listener and the laser distance detector device.

19. Motion of the Stereophonic Sound Image with the Passage of Time.

Figure 20:
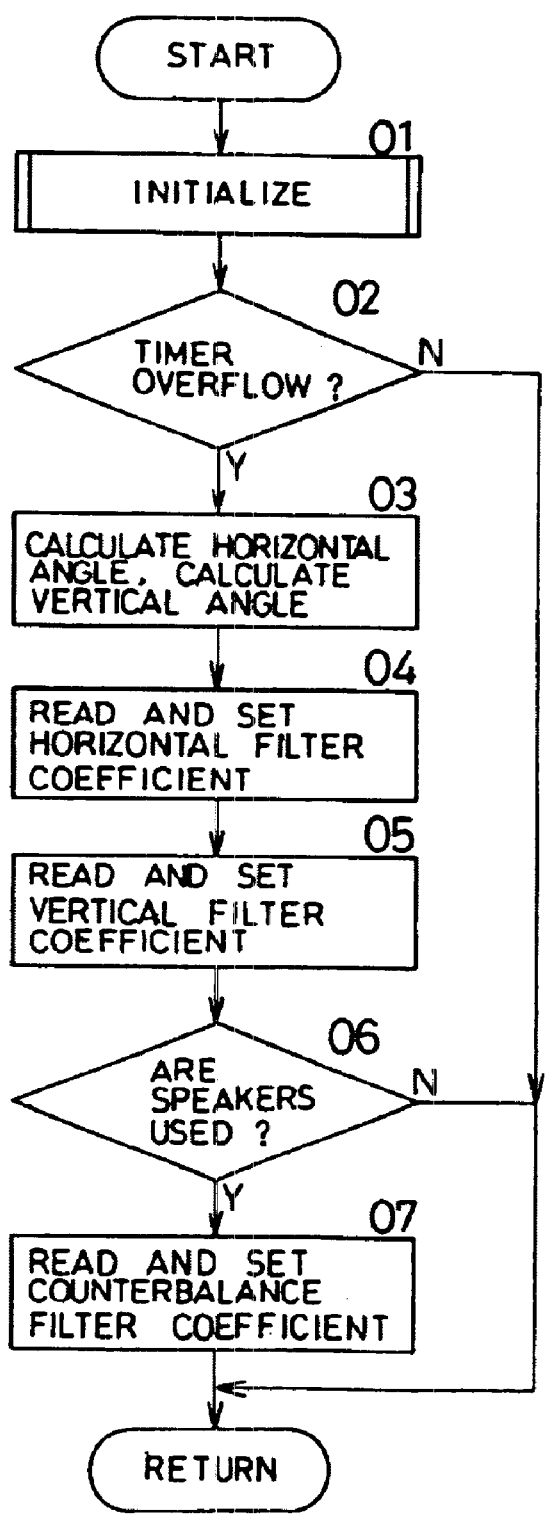
FIG. 20 is a flowchart for moving the stereophonic sound image with the passage of time.

FIG. 20 is a flowchart for moving the stereophonic sound image with the passage of time. After the initialization processing (step 01), the angle in the horizontal direction and the angle in the vertical direction are calculated (step 03) if the programmable timer (not shown) has beer overflown (step 02).

The filter coefficients f, g, h, i, j, k, l, m, K and (1-K), L and (1-L), M and (1-M), N and (1-N), P and (1-P), Q and (1-Q), R and (1-R), S and (1-S), O and T corresponding to the calculated angle in the horizontal direction, are read out from the program/data storage unit 4, and are fed to the left horizontal characteristics circuit 34L and to the right horizontal characteristics circuit 34R. Similarly, the level coefficients I, J are read out from the program/data storage unit 4, and are sent to the right-and-left back-and-forth weighting circuit 32. The delay coefficient DT is read out from the program/data storage unit 4, and is sent to he left delay circuit 33L and to the right delay circuit 33R (step 04).

Further, the filter coefficients a, b, c, d, e, A and (1-A), B and (1-B), C and (1-C), E and (1-E), F and (1-F), G and (1-G), D and H corresponding to the calculated angle in the vertical direction, are read out from the program/data storage unit 4, and are fed to the vertical characteristics circuit 31L and to the vertical characteristics circuit 31R (step 05).

Figure 21:
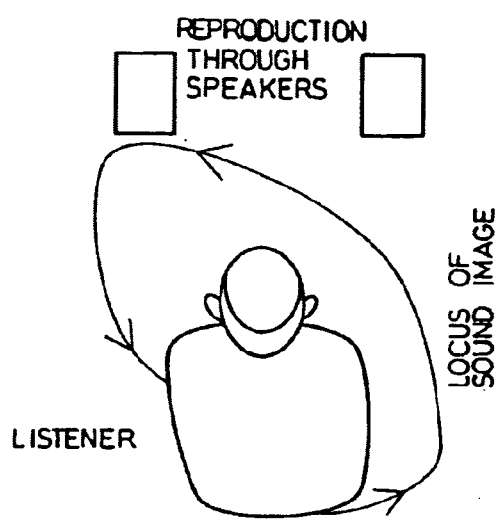
FIG. 21 is a view illustrating a locus of stereophonic sound image that moves with the passage of time.
Figure 21:
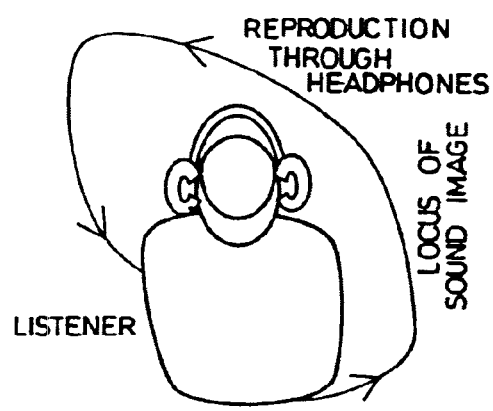

Thus, the filter coefficient changes with the passage of time, and the stereophonic sound image formed corresponding thereto varies with the passage of time as shown in FIG. 21. In FIG. 21, the locus of motion of the sound image is nearly circular, and the period of change in the angle in the horizontal direction is nearly the same as the period of change in the angle in the vertical direction. However, the locus of motion of the sound image is undulated when either one becomes an integer times as great as the other one. Further, if there is a slight difference between the period of change in the angle in the horizontal direction and the period of change in the angle in the vertical direction, the circular top of the locus of motion of the sound image in FIG. 21 circulates.

In FIG. 21, the sound image data SI changes like (horizontal direction, vertical direction)=(0 degree, 0 degree)–(90 degrees, 45 degrees)–(180 degrees, 0 degree)–(270 degrees, −45 degrees). The speed of change of one round, i.e., the period of change is, for example, one second. The period of change is determined by a preset value of a programmable timer that will be described next.

The preset value of the programmable timer can be changed by using a controller 2. Due to this change, the speed of motion of the stereophonic sound image changes. The preset value of the programmable timer is input through a group of panel switches 13, and is changed upon the setting by the operator. Further, the preset value of the programmable timer is stored for every musical factor data, are input, are read out, or are read out and determined depending upon the musical factor data that are read out or are fed.

Therefore, the moving speed of the stereophonic sound image that is formed varies depending upon a change in the above-mentioned tone pitch (tone pitch range) data (tone pitch-determining factor), sounding time data, sound image data, field-of-play data, number-of-sounds data, resonance degree data, timbre data (timbre-determining factor), touch data (speed/strength of sounding instruction operation) effect data, rhythm data, quantize data, modulation data, tempo data and envelope data.

When the right and left speakers 30SR and 30SL are used (step 06), the filter coefficients p, q, r, s, t, u, v, w, x, y and z are read out from the program/data storage unit 4, and are fed to the crosstalk cancel circuit 35 (step 07). Thus, the counterbalance sound components L2 and R2 are generated.

The present invention is in no way limited to the above-mentioned embodiments only but can he changed in a variety of ways without departing from the gist of the invention. Though the tone waveform data MW were digital waveform data, they may be analog waveform data and, besides, the digital filters may be analog filters. Further, the tone waveform data MW may be those in which a given waveform repeats periodically, or may be a sound signal without periodic property, such as waveforms of an attach portion that changes in a complex manner, a non periodic PCM waveform of from the attack to the release, or noise which does not periodically change.

Further, the output from the vertical characteristics circuit 31L may be sent to an upper speaker, and the output from the vertical characteristics circuit 31R may be sent to a lower speaker. The upper speaker and the lower speaker are arranged being separated from each other up and down between the right speaker 30SR and the left speaker 30SL. In this case, the magnitudes of the sound data fed to the upper and lower sound systems, assume different values depending upon the position of the stereophonic sound image due to the multiplier 55 in the vertical characteristics circuit 31L and the multiplier 70 in the vertical characteristics circuit 31R, so that the stereophonic sound image that is formed is more emphasized and is clarified.

The left sound data from the vertical characteristics circuit 31L or the left sound data from the adder 97 in the right-and-left back-and-forth weighting circuit 33, may be directly sent to the left speaker 30SL or to the left headphone speaker 30HL. The right sound data from the vertical characteristics circuit 31R or the right sound data from the adder 98 in the right-and-left back-and-forth weighting circuit 33, may be directly sent to the right speaker 30SR or to the right headphone speaker 30HR. In this case, the right-and-left back-and-fourth weighting circuit 33 and/or the left delay circuit 33L, the right delay circuit 33R, the left horizontal characteristics circuit 34L and the right horizontal characteristics circuit 34R, are omitted.

In the circuit of FIG. 4, further, the vertical characteristics circuits 31L and 31R and/or the right-and-left back-and-forth weighting circuit 33, may be omitted. In this case, the tone waveform data MW from the multiplier 25 are directly input to the right-and-left back-and-forth weighting circuit 33 or to the left delay circuit 33L and to the right delay circuit 33R. In the above-mentioned stereophonic apparatus, the digital filter means were provided in two sets for the right and left or for the upper and lower two channels. However, another two sets or more sets of digital filter means may be provided for the preceding and succeeding channels.

The values of the filter coefficients a, b, c, d, e, or f, g, h, i, j, k, l, m, or p, q, r, s, t, u, v, w, x, y, z, may not be fixed values but may be varied depending upon the sound image data SI. This also causes the position of the stereophonic sound image that is formed to change back and forth, right and left, or up and down.

The filter distribution circuits 71, 72, 73, 76, 77, 78, 111, 112, 113, 114, 116, 117, 118 and 119 may be connected in parallel in addition to being continuously connected (cascade connection). In the digital filter operation using the above digital filters, the DSP (digital signal processor) may be used to execute the digital filter operation based on the operation program (flowchart) of filtering.

In this specification, "digital filters" stand for digital filters 41, 46, 51, 56, 61, 66, 121, 126, 131, 136, 141, 146, 151 and 156 in a narrow sense. In a broad sense, however, the "digital filters" include multipliers 42, 43, 47, 48, 52, 53, 57, 58, 62, 63, 67, 68, adders 44, 49, 54, 59, 64, 69, multipliers 122, 123, 127, 128, 132, 133, 137, 138, 142, 143, 147, 148, 152, 153, 157, 158, and adders 124, 129, 134, 139, 144, 149, 154 and 159 that are surrounding the filters.

The filter coefficients A, B, C, E, F, G, K, L, M, N, P, Q, R and S represent distribution ratios of when the sound data put to the digital filter operation and the sound data not put to the digital filter operation are synthesized together. The operation formula for finding the distribution ratio was described earlier, but can be briefly described in the following way. Generally, the distribution ratio can be found by using the following trigonometric function such as cosine function for the angle SI of the sound image in the horizontal direction or for the angle SI of the sound image in the vertical direction, $$\alpha \times \cos(2\pi \times SI/Z + \beta) + \gamma \times \cos(4\pi SI/Z\delta + \xi)$$

where SI is an angle of the sound image in the up and down vertical direction, and $\alpha$, $\beta$, $\gamma$, $\delta$ and $\xi$ are positive or negative constants, $$\mu \times \cos(\pi \times SI/z+v) + \xi \times \cos(2\pi \times SI/Z+\rho) + \sigma$$

where SI is an angle of the sound image in the right-and-left back-and-forth horizontal direction, and $\mu$, $v$, $\xi$, $\rho$ and $\sigma$ are positive or negative constants, and $\mu$ may often be 0.

Z may be 180 degrees or 90 degrees, and SI may often be (360−SI). The operation formula of the cosine function may be replaced by the operation formula of the sine function if the value of 90 degrees is corrected by addition or subtraction.

In the crosstalk cancel circuit 35 of FIG. 17, the crosstalk can be canceled not only in one stage but also in a plurality of stages. In this case, the right counterbalance sound component R2 input to the left speaker 30SL, is input to the left delay unit 185L in a crossing manner, and the counterbalance sound component R3 of the second stage is generated from the right speaker 30SR. The counterbalance sound component R3 of the second stage cancels the right counterbalance sound component R2 that reaches the right ear. Further, the left counterbalance sound component L2 input to the right speaker 30SR, is input to the right delay unit 185R in a crossing manner, and the counterbalance sound component L3 of the second stage is generated from the left speaker 30SL. The counterbalance sound component L3 of the second stage cancels the left counterbalance sound component L2 reaching the left ear. Due to this cross input, the counterbalance sound components R4, L4, R5, L5, R6, L6, - - - of the third stage, fourth stage, fifth stage, - - - , are formed successively.

What is claimed is:

1. A stereophonic device comprising:
   first digital filter means for subjecting generated sound data to the digital filter operation,
   second digital filter means for subjecting the generated sound data to the digital filter operation,
   said first digital filter means and said second digital filter means execute same operation in parallel therewith at the same time;
   first synthesizing means for synthesizing sound data subjected to the digital filter operation and sound data not subjected to the digital filter operation in said first digital filter means at predetermined distribution ratios;
   second synthesizing means for synthesizing sound data subjected to the digital filter operation and sound data not subjected to the digital filter operation in said second digital filter means at predetermined distribution ratios;
   generating means for sending the sound data synthesized by said first synthesizing means and the sound data synthesized by said second synthesizing means to different sound systems in parallel therewith at the same time, forming stereophonic sound image at the sound systems and generating stereophonic sound, and
   moving means for moving stereophonic sound image position to back and forth, right and left or up and down by changing the distribution ratios of the both synthesized sound data in said first or said second synthesizing means.

2. The stereophonic device comprising according to the claim 1,
   filter coefficient supplied to said first digital filter means is different from filter coefficient supplied to second digital filter means,
   one of said first and second digital filter means execute digital filter operation that the tone is diffracted by, or transmits through, the head to form a sound image in the vertical direction for one ear, and
   the other of said first and second digital filter means execute digital filter operation to form a sound image in the vertical direction for the other ear.

3. The stereophonic device according to the claim 2, further comprising,
   third digital filter means for subjecting generated sound data or the sound data from said first digital filter means to the digital filter operation, and subjecting to the filter process for forming the sound image in the horizontal direction for one ear, and
   fourth digital filter means for subjecting generated sound data or the sound data from said second digital filter means to the digital filter operation, and subjecting to the filter process for forming She sound image in the horizontal direction for the other ear.

4. The stereophonic device comprising according to the claim 3,
   said third digital filter means and said fourth digital filter means execute same operation in parallel therewith at the same time,
   filter coefficient supplied to said third digital filter means is different from filter coefficient supplied to said fourth digital filter means,
   one of said third and fourth digital filter means execute digital filter operation that the tone is diffracted by, or transmits through, the head to form a sound image in the horizontal direction for one ear, and
   the other of said third and fourth digital filter means execute digital filter operation to form a sound image in the horizontal direction for the other ear.

5. The stereophonic device comprising according to the claim 3,
   the sound data subjected by digital filter operation from the third digital filter and from the fourth digital filter are sent to different sound systems in parallel therewith at the same time, forming stereophonic sound image in the horizontal direction besides the vertical direction at the sound systems and generating stereophonic sound.

6. The stereophonic device comprising according to the claim 3,
   the digital filter operation in connection with one ear and the other ear is executed to realize frequency characteristics of the sound that is diffracted by, or has transmitted through, the human head or the ear with respect to the sound of before diffracted or transmitted in the third digital filter or the fourth digital filter, and
   the frequency characteristics are measured or operated depending upon the diffraction and transmission in the horizontal direction, vertical direction, right-and-left direction, back-and-forth direction, up-and-down direction or in inclined directions among them of the human head or ears.

7. The stereophonic device comprising according to the claim 1,
   counterbalance sound components are generated and supplied to one sound system,
   the counterbalance sound components cancel sound reached from the other sound system to one ear and become effective only sound reached from the other sound system to the other ear, and
   the counterbalance sound components are generated by digital filter operation that the sound generated from the other sound system is diffracted by, or transmits through, the head and reach to one ear.

8. The stereophonic device comprising according to the claim 1, the predetermined distribution ratios at which the sound data subjected to the digital filter operation and the sound data not subjected to the digital filter operation are synthesized is also the filter coefficient, the predetermined distribution ratios is founded according to the following formula in the vertical direction angle or horizontal direction angle, $$\alpha \times \cos(2\pi \times SI/Z + \beta) + \gamma \times \cos(4\pi \times SI/Z + \delta) + \epsilon$$

where SI is an angle of the sound image in the vertical direction, and $\alpha$, $\beta$, $\gamma$, and $\delta$ are positive or negative constants, $$\mu \times \cos(\pi \times SI/Z + \nu) + \xi \times \cos(2\pi SI/Z + \rho) + \rho$$

where SI is an angle of the sound image in the right-and-left back-and-forth horizontal direction, and $\mu$, $\nu$, $\xi$, $\rho$ and $\sigma$ are positive or negative constants, and $\mu$ may often be 0, z may be 180 degrees or 90 degrees, and SI may often be (360−SI).

9. The stereophonic device comprising according to the claim 1, the filter coefficients for the digital filter operation are supplied to said first digital filter and said second digital filter, and a value of the filter coefficient supplied to said first digital filter is different from a value of the filter coefficient supplied to said second digital filter.

10. The stereophonic device comprising according to the claim 1, the digital filter operation in connection with one ear and the other ear is executed to realize frequency characteristics of the sound that is diffracted by, or has transmitted through, the human head or the ear with respect to the sound of before diffracted or transmitted in the first digital filter or the second digital filter.

11. The stereophonic device comprising according to the claim 10, the frequency characteristics are measured or operated depending upon the diffraction and transmission in the horizontal direction, vertical direction, right-and-left direction, back-and-forth direction, up-and-down direction or in inclined directions among them of the human head or ears.

12. The stereophonic device comprising according to the claim 1, the digital filter operation is executed for the sound generated from one sound system, the digital filter operation being based on the difference in the frequency characteristics between the sound reaching one ear from the one sound system and the sound reaching the other ear from the one sound system is executed to the sound generated from the one sound system, and the executed sound is generated from the other sound system as the counterbalance sound components.

13. The stereophonic device comprising according to the claim 1, the value of the filter coefficient for operating the counterbalance sound component varies depending upon the relationship or angle between the mutual positions of the sound systems and/or the position of the listener.

14. The stereophonic device comprising according to the claim 1, the counterbalance sound component is not generated when the sound from one sound system reaches one ear only but does not reach the other ear, like in such a sound system as headphone, the counterbalance sound component is generated when the sound from one sound system reaches not only one ear but also the other ear like a sound system using plural speakers, and the counterbalance sound component is generated or not generated depending upon the sound system that is used.

15. The stereophonic device comprising according to the claim 1, the magnitudes of the sound fed to different sound systems, assume different values depending upon the position of the stereophonic sound image, and the magnitudes of the sound are according to the value of the filter coefficient.

16. The stereophonic device comprising according to the claim 1, phases or start timings of the sound fed to different sound systems have values that differ depending upon the positions of the stereophonic sound images, the phases or the start timings of the sound are according to the value of the filter coefficient.

17. The stereophonic device comprising according to the claim 1, sound data subjected to the digital filter operation and sound data not subjected to the digital filter operation are synthesized each other, the synthesis ratios is the distribution ratios, and the synthesis ratios differs for each of the frequency bands or the frequency bands characteristics.

18. The stereophonic device comprising according to the claim 1, the filter coefficient changes depending upon the passage of time and so that the stereophonic sound image moves depending upon the passage of time, and the speed of these changing is changed according to the musical factor or the setting by the operator.

19. The stereophonic device comprising according to the claim 1, the first and second digital filter means execute the digital filter operation to form a sound image in the predetermined horizontal direction for the both ears of the human.

20. The stereophonic device comprising according to the claim 1, the results of the digital filter operation are weighted and synthesized each other and a sound image in the other horizontal direction.

21. The stereophonic device comprising according to the claim 1, the results of the digital filter operation from the first and the second digital filter means are symmetrically inverted and symmetrical sound image is formed.

22. A stereophonic method for comprising first digital filter means for subjecting generated sound data to the digital filter operation, second digital filter means for subjecting the generated sound data to the digital filter operation, said first digital filter means and said second digital filter means execute same operation in parallel therewith at the same time; which comprising:

making synthesized sound data subjected to the digital filter operation and sound data not subjected to the digital filter operation in said first digital filter means at predetermined distribution ratios;

making synthesized sound data subjected to the digital filter operation and sound data not subjected to the digital filter operation in said second digital filter means at predetermined distribution ratios;

making sent the both synthesized sound data to different sound systems in parallel therewith at the same time, making formed stereophonic sound image at the sound systems and making generated stereophonic sound, and making moved stereophonic sound image position to back and forth, right and left or up and down by changing the distribution ratios of the both synthesized sound data in said first or said second digital filter.

23. Computer programs for forming stereophonic sound for comprising first digital filter means for subjecting generated sound data to the digital filter operation, second digital filter means for subjecting the generated sound data to the digital filter operation, said first digital filter means and said second digital filter means execute same operation in parallel therewith at the same time; which comprising:

process for making synthesized sound data subjected to the digital filter operation and sound data not subjected to the digital filter operation in said first digital filter means at predetermined distribution ratios;

process for making synthesized sound data subjected to the digital filter operation and sound data not subjected to the digital filter operation in said second digital filter means at predetermined distribution ratios;

process for making sent the both synthesized sound data to different sound systems in parallel therewith at the same time, making formed stereophonic sound image at the sound systems and making generated stereophonic sound, and process for making moved stereophonic sound image position to back and forth, right and left or up and down by changing the distribution ratios of the both synthesized sound data in said first or said second digital filter.

* * * * *